US011152565B2

(12) United States Patent
Chen et al.

(10) Patent No.: US 11,152,565 B2
(45) Date of Patent: Oct. 19, 2021

(54) MEMORY DEVICE AND MANUFACTURING METHOD THEREOF

(71) Applicant: TAIWAN SEMICONDUCTOR MANUFACTURING CO., LTD., Hsinchu (TW)

(72) Inventors: Yu-Sheng Chen, Taoyuan (TW); Da-Ching Chiou, Hsinchu (TW); Jau-Yi Wu, Hsinchu County (TW); Carlos H. Diaz, Mountain View, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 16 days.

(21) Appl. No.: 16/573,615

(22) Filed: Sep. 17, 2019

(65) Prior Publication Data
US 2021/0083181 A1    Mar. 18, 2021

(51) Int. Cl.
*H01L 45/00* (2006.01)
*H01L 27/24* (2006.01)

(52) U.S. Cl.
CPC .......... *H01L 45/06* (2013.01); *H01L 27/2427* (2013.01); *H01L 27/2436* (2013.01); *H01L 45/065* (2013.01); *H01L 45/12* (2013.01); *H01L 45/128* (2013.01); *H01L 45/1233* (2013.01); *H01L 45/1246* (2013.01); *H01L 45/1253* (2013.01); *H01L 45/141* (2013.01); *H01L 45/1608* (2013.01); *H01L 45/1675* (2013.01)

(58) Field of Classification Search
CPC ....... H01L 45/06; H01L 45/065; H01L 45/04; H01L 45/12; H01L 45/122; H01L 45/1233; H01L 45/1246; H01L 45/128; H01L 27/2427
See application file for complete search history.

(56) References Cited

U.S. PATENT DOCUMENTS

2009/0261313 A1* 10/2009 Lung ...................... H01L 45/126 257/4
2010/0051893 A1* 3/2010 Kim ....................... H01L 45/144 257/2
2019/0363250 A1* 11/2019 Appenzeller ...... G11C 13/0007
2021/0020835 A1* 1/2021 Lee ..................... G11C 13/0004

FOREIGN PATENT DOCUMENTS

CN    101436643 B  * 12/2011    ......... H01L 45/1675
CN    110212088 A  *  9/2019

* cited by examiner

Primary Examiner — Joseph C. Nicely
(74) Attorney, Agent, or Firm — Maschoff Brennan

(57) ABSTRACT

A memory device includes a conductive wire, a first 2-D material layer, a phase change element, and a top electrode. The first 2-D material layer is over the conductive wire. The phase change element extends along a surface of the first 2-D material layer distal to the conductive layer. The top electrode is over the phase change element.

20 Claims, 34 Drawing Sheets

MEMORY DEVICE AND MANUFACTURING METHOD THEREOF

BACKGROUND

Flash memory is a widely used type of nonvolatile memory. However, flash memory is expected to encounter scaling difficulties. Therefore, alternatives types of nonvolatile memory are being explored. Among these alternatives types of nonvolatile memory is phase change memory (PCM). PCM is a type of nonvolatile memory in which a phase of a phase change element is employed to represent a unit of data. PCM has fast read and write times, non-destructive reads, and high scalability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
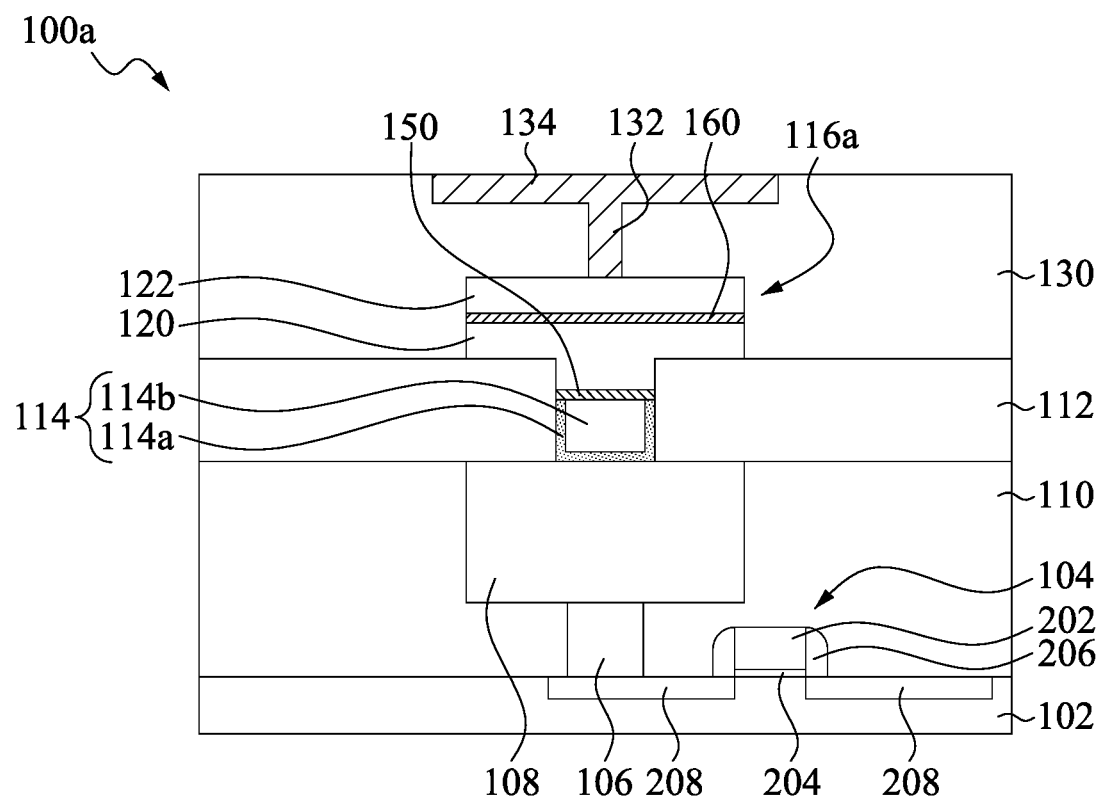
FIG. 1 is a cross-sectional view of a memory device in according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A phase change memory (PCM) cell includes a phase change element (PCE) sandwiched between a bottom electrode and a top electrode. In some embodiments, the PCE is made of chalcogenide glass. Chalcogenide glass has crystalline and amorphous states with drastically different electrical resistivity values, such that the PCE can be switched between the crystalline and amorphous states to correspond to different data states. More particularly, during operation of some PCM cells, the PCE can be heated to a higher temperature (e.g., over 600 degrees Celsius) than its melting point, which causes the chalcogenide glass to lose its crystallinity. The PCE can then be quickly cooled or "quenched" to "freeze" the PCE in an amorphous, high resistance state, which can for example correspond to a "0" data state. This operation can be referred to as a "reset" operation of the PCM cell. Conversely, by heating the chalcogenide glass to a lower temperature (e.g., about 100-150 degrees Celsius), wherein the lower temperature is above its crystallization point but below its melting point, the PCE will transform into the low-resistance, crystalline state, which can for example correspond to a "1" state. This operation can be referred to as a "set" operation of the PCM cell.

Referring to FIG. 1, a cross-sectional view of a memory device 100a in accordance with some embodiments is provided.

The memory device 100a includes a phase change memory (PCM) cell 116a. The PCM cell 116a includes a bottom electrode 114, a phase change element (PCE) 120, a top electrode 122, a first two-dimensional (2-D) material layer 150, and a second 2-D material layer 160. The bottom electrode 114 is disposed within a dielectric layer 112. The first 2-D material layer 150 overlies the bottom electrode 114. The PCE 120 overlies the bottom electrode 114 and the first 2-D material layer 150. The second 2-D material layer 160 overlies the PCE 120. The top electrode 122 overlies the second 2-D material layer 160. The PCE 120 is disposed within the dielectric layer 112 and an inter-metal dielectric (IMD) layer 130. The second 2-D material layer 160 and the top electrode 122 are disposed within IMD layer 130.

In some embodiments, the PCE 120 is spaced from the bottom electrode 114 (or the conductive wire 108) at least in part by the first 2-D material layer 150. The PCE 120 has a sidewall extending upwards from a surface of the first 2-D material layer 150 distal to the conductive wire 108. In some embodiments, an entirety of a surface of the PCE 120 proximal to the conductive wire 108 extends along a surface of the first 2-D material layer 150 distal to the conductive wire 108. In some embodiments, the second 2-D material layer 160 extends along a surface of the PCE 120 distal to the conductive wire 108. In some embodiments, the second 2-D material layer 160 overlaps an entirety of a surface of the PCE 120 distal to the conductive wire 108. In some embodiments, the dielectric layer 112 has a sidewall extending from a sidewall of the PCE 120 to a sidewall of the first 2-D material layer 150. In some embodiments, the top electrode 122 is spaced from the PCE 120 at least in part by the first 2-D material layer 150. In some embodiments, the dielectric layer 112 laterally surrounds the sidewall of the PCE 120, and the second 2-D material layer 160 is separated from the dielectric layer 112. In some embodiments, the first 2-D material layer 150 is under (e.g., vertically below) the second 2-D material layer 160.

In some embodiments, the PCM cell 116a is disposed over a substrate 102 with an inter-metal dielectric (IMD) layer 110 disposed over the substrate 102. A bottom conductive wire 108 overlying a bottom interconnect via 106 electrically couples the PCM cell 116a to a transistor 104. In some embodiments, the bottom conductive wire 108 and bottom interconnect via 106 electrically couple the PCM cell 116a to underlying metal layers and/or an electrical component such as a resistor, a capacitor, and/or a diode. A conductive via 132 is disposed over the top electrode 122 and within the IMD layer 130, and connects the top electrode 122 to upper metal layers such as an upper conductive wire 134 in the IMD layer 130. In some embodiments, the conductive via 132 and the upper conductive wire 134 may electrically couple the top electrode 122 to a bit line (not shown).

In some embodiments, during operation of the PCM cell 116a, the PCM cell 116a varies between states depending upon a voltage applied from the upper conductive wire 134 to the bottom conductive wire 108. The PCM cell 116a may, for example, be in a low-resistance state where the PCE 120 is in a crystalline phase. Changing the PCE 120 to the crystalline phase (i.e., set operation) may, for example, be performed by heating the PCE 120 to a relatively low temperature (e.g., higher than crystallization point of the PCE 120 but lower than the melting point of the PCE 120) using Joule heating resulting from an electric current flowing through the PCE 120. The electric current flowing through the PCE 120 in the set operation is referred to as a set current $I_{set}$. On the other hand, the PCM cell 116a may, for example, be in a high resistance state where the PCE 120 is in an amorphous phase. Changing the PCE 120 to the amorphous phase (i.e., reset operation) may, for example, be performed by heating the PCE 120 to a relatively high temperature (e.g., higher than the melting point of the PCE 120) using Joule heating resulting from another electric current flowing through the PCE 120. The electric current flowing through the PCE in the reset operation is referred to as a reset current $I_{reset}$. As a result, either the set current $I_{set}$ or the reset current $I_{reset}$ is dominated by the Joule heating. When the thermal confinement in the PCE 120 is poor, the time and/or set current $I_{set}$/reset current $I_{reset}$ needed to change the phase of the PCE 120 are increased, causing the switching speeds and/or power consumption of the PCRAM device to increase.

Some embodiments in accordance with this disclosure incorporate 2-D materials (e.g., 2-D material layers 150 and 160) into the PCM cell 116a. Utilizing the 2-D material in a PCM cell 116a can provide a number of benefits such as, among others, low through-plane thermal conductivity (i.e., high thermal boundary resistance at interface between 2-D material and other materials). In some embodiments, the first 2-D material layer 150 and the second 2-D material layer 160 may be or include the same material. The 2-D materials can be mono-layers of materials held together by chemical bonds and have outstanding electrical and physical properties. Mono-layers can be stacked on each other to form a 2-D material layer that includes individual monolayers. In some embodiments, individual monolayers of graphene, thin layers of black phosphorus (also known as phosphorene), graphene analogues (such as silicene, gemanene, stannene, etc.), and/or boron nitride can be stacked to create the 2-D material layer. Another example of a 2-D material is transition metal dichalcogenides (TMDs). TMDs have a general formula of $MX_2$, where M denotes a transition metal from, for example, periodic table column {IVB, VB, VIB} (e.g., molybdenum (Mo), tungsten (W), niobium (Nb), haftnium (Hf), or tantalum (Ta)), and X denotes an element from the group of {sulfur (S), selenium (Se), or tellurium (Te)}.

2-D material has an extremely high in-plane thermal conductivity (i.e., thermal conductivity in a direction parallel with a largest surface of the 2-D material layer) but the through-plane conductivity of the 2-D material (i.e., thermal conductivity in a direction perpendicular to the largest surface of the 2-D material layer) is at least two orders of magnitude lower than the in-plane thermal conductivity. As an example of graphene, the high in-plane thermal conductivity results from the covalent sp2 bonding between carbon atoms whereas the poor through-plane thermal conductivity is mainly due to weak van der Waals coupling in the through-plane direction (i.e., direction perpendicular to the largest surface of the 2-D material layer). Because of their 2-dimensional nature, however, graphene sheets or graphene nanoplatelets tend to align or orient parallel to the thermal interface. As a result, the through-plane thermal conductivity is substantially decreased.

Accordingly, due to the low through-plane thermal conductivity, the thermal boundary resistance (TBR) at the interface between the 2-D material layer 150 (or 160) and the PCE 120 is increased as compared to a TBR at the interface between the bottom electrode 114 (or top electrode 122) and the PCE 120, if the 2-D materials 150 and 160 are omitted. Moreover, the TBR at the interface between the 2-D material layer 150 (or 160) and the PCE 120 is also higher than the TBR at the interface between the dielectric layer 112 and the PCE 120 and the TBR at the interface between the IMD layer 130 and the PCE 120. As a result, thermal confinement of the PCE 120 can be improved by the 2-D material layers 150 and 160, so that less Joule heating is needed to change the phase of the PCE 120, thereby allowing for the PCM cell 160 to have a lower power consumption and/or higher switching speed.

Moreover, the electrical properties of the 2-D materials make them serve as promising candidates for use in PCM cell 116a due to their carrier transport mechanism. In some embodiment, the 2-D material layers 150 and 160 may be made of materials which have high carrier mobility (or electrical conductivities), such as graphene. That is because the surfaces of these 2-D materials demonstrate metallic/conductive behavior when they extend along the surface of a metal. For example, a graphene layer 150 allows a current to flow from (or to) the bottom electrode 114 to (or from) the PCE 120 through the graphene layer 150. Similarly, a graphene layer 160 allows a current from (or to) the PCE 120 to (or from) the top electrode 122 through the graphene layer 160. In some other embodiments, the 2-D material layers 150 and 160 may be made of insulating 2-D material, such as boron nitride (BN). In such embodiments, the 2-D material layers 150 and 160 are thin enough such that currents may still flow through the 2-D material layers 150 and 160 because of tunneling effect. For example, if the 2-D material layers 150 and 160 are made of BN, the BN layers 150 and 160 has a thickness in a range from about 0.7 nm to about 3.5 nm. If the thickness of the BN layers 150 and 160 is greater than about 3.5 nm, the BN layers 150 and 160 might be too thick to allow currents tunneling through them. If the thickness of the BN layers 150 and 160 is less than about 0.7 nm, the thermal confinement of the PCE 120 might be unsatisfactory for lowering the set/reset currents.

In some embodiments, the PCE 120 may, for example, be or include chalcogenide materials, which consist of at least one chalcogen ion (e.g., a chemical element in column VI of the period table), sulfur (S), selenium (Se), tellurium (Te), selenium sulfide (SeS), germanium antimony tellurium (GeSbTe), silver indium antimony tellurium (AgInSbTe), germanium telluride (GeTe), antimony telluride ($Sb_2Te_3$), germanium antimony (GeSb), or the like. The PCE 120 may be doped or undoped. In some embodiments where the PCE 120 is doped, the PCE 120 may be N-doped, C-doped, O-doped, In-doped, Si-doped, Sn-doped, Ga-doped, As-doped, Se-doped.

In some embodiments, the top electrode 122 and the bottom electrode 114 may be or include the same material. In some embodiments, the top electrode 122 and/or the bottom electrode 124 may, for example, respectively be or include titanium nitride (TiN), titanium tungsten (TiW), titanium tungsten nitride (TiWN), titanium tantalum nitride (TiTaN), tantalum nitride (TaN), tungsten (W), or the like. In some embodiments, the conductive via 132 and the upper conductive wire 134 may, for example, respectively be or comprise copper (Cu), aluminum (Al), or the like. In some embodiments, the dielectric layer 112 may, for example, be or comprise SiN, SiC, SiON, SiOC, or the like. In some embodiments, the IMD layer 130 may, for example, be or comprise tetra-ethyl-ortho-silicate (TEOS) (e.g., plasma enhanced TEOS, low particle TEOS, etc.), an extreme low dielectric, or the like.

In some embodiments, the bottom electrode 114 is a multi-layer structure. For example, the bottom electrode 114 may include a diffusion barrier layer 114a and an electrode layer 114b wrapped by the diffusion barrier layer 114a. The diffusion barrier layer 114a may be or include conductive oxide, nitride, or oxynitride of a metal selected from the group consisting of Al, Mn, Co, Ti, Ta, W, Ni, Sn, Mg. In some embodiments, diffusion barrier layer 114a is TaN. Diffusion barrier layer 114a can have any suitable thickness. A suitable thickness is large enough to provide an effective diffusion barrier while not being so large as to cause excessive resistance. The electrode layer 114b may be or include titanium nitride (TiN), titanium tungsten (TiW), titanium tungsten nitride (TiWN), titanium tantalum nitride (TiTaN), tantalum nitride (TaN), tungsten (W), or the like. However, in some embodiments, the diffusion barrier layer 114a is optional and thus can be omitted.

The transistor 104 includes gate electrode 202, gate dielectric 204, transistor sidewall spacers 206, and source/drain regions 208. The bottom interconnect via 106 is electrically coupled to a source/drain region 208 of the transistor 104. The source/drain regions 208 are disposed within the substrate 102 on either side of the gate electrode 202. Further, the source/drain regions 208 are doped to have a first conductivity type which is opposite a second conductivity type of a channel region under the gate dielectric 204. The gate electrode 202 may be, for example, doped polysilicon or a metal, such as aluminum, copper, tungsten, or combinations thereof. The gate dielectric 204 may be, for example, an oxide, such as silicon dioxide, or a high-k dielectric material. The transistor sidewall spacers 206 can be made of silicon nitride (e.g., $Si_3N_4$), for example.

FIGS. 2A to 2K illustrate cross-sectional views of some embodiments of a method of forming a memory device including a PCM structure according to the present disclosure. In greater details, FIGS. 2A to 2K illustrate a method for forming the memory device 100a described in FIG. 1. Although the cross-sectional views shown in FIGS. 2A to 2K are described with reference to a method, it will be appreciated that the structures shown in FIGS. 2A to 2K are not limited to the method but rather may stand alone separate of the method. Although FIGS. 2A to 2K are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 2A:
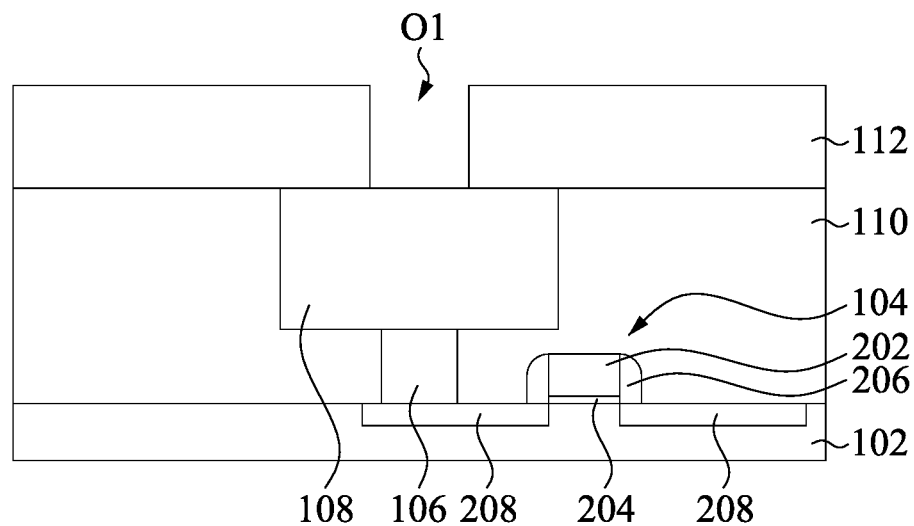
FIGS. 2A-2K are cross-sectional views of a memory device in various stages of fabrication in accordance with some embodiments of the present disclosure.

As shown in cross-sectional view of FIG. 2A, an initial structure includes the substrate 102, the transistor 104, the bottom interconnect via 106, the IMD layer 110, the bottom conductive wire 108, and the dielectric layer 112. Formation of the bottom conductive wire 108 may use a single-damascene or dual-damascene process. For example, formation of the bottom conductive wire 108 includes forming a trench in the IMD layer 110 using suitable etching techniques, overfilling the trenches with one or more metal layers (TiN layer, TaN layer and/or copper layer) using suitable deposition techniques, and planarizing the one or more metal layers with the IMD layer 110 using, for example, one or more chemical mechanical polishing (CMP) processes.

The dielectric layer 112 is patterned to form an opening O1. The opening O1 exposes the top surface of the bottom conductive wire 108. In some embodiments, the opening O1 may be formed by, for example, forming a patterned mask (e.g., photoresist mask) over the dielectric layer 112, followed by etching the dielectric layer 112 using the patterned mask as an etch mask to form the opening O1 in the dielectric layer 112. After the etching process, the patterned mask is removed using, for example, an ashing process, if the patterned mask is made of photoresist.

Figure 2B:
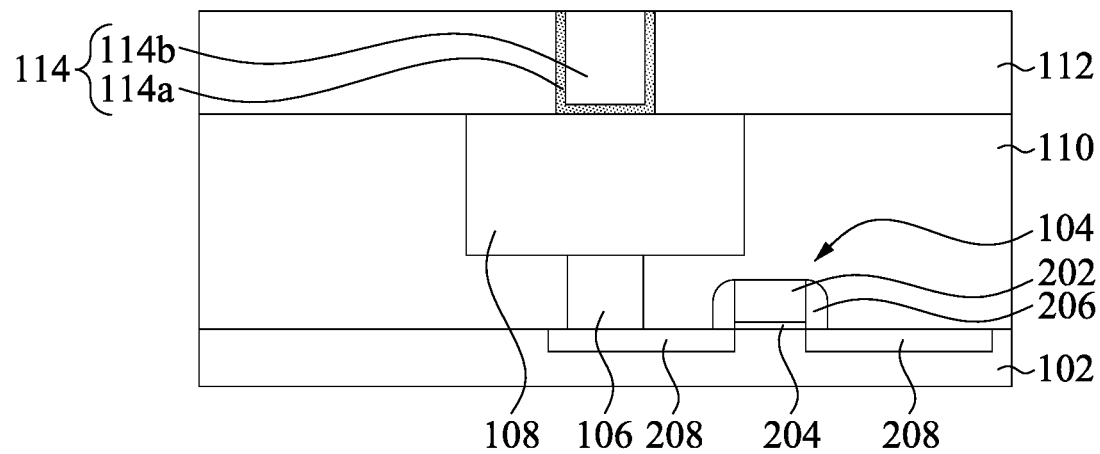

As shown in cross-sectional view of FIG. 2B, the bottom electrode 114 is formed in the opening O1 (see FIG. 2A). In some embodiments, the bottom electrode 114 may be formed by depositing in sequence the diffusion barrier 114a and the electrode layer 114b into the opening O1, followed by performing one or more CMP processes to remove excess materials of the diffusion barrier 114a and the electrode layer 114b outside the opening O1. In some embodiments, the bottom electrode 114 may include TiN, TaN, copper, and/or tungsten layers deposited by suitable processes, such as chemical vapor deposition (CVD), physical vapor deposition (PVD), atomic layer deposition (ALD), or the like.

Figure 2C:
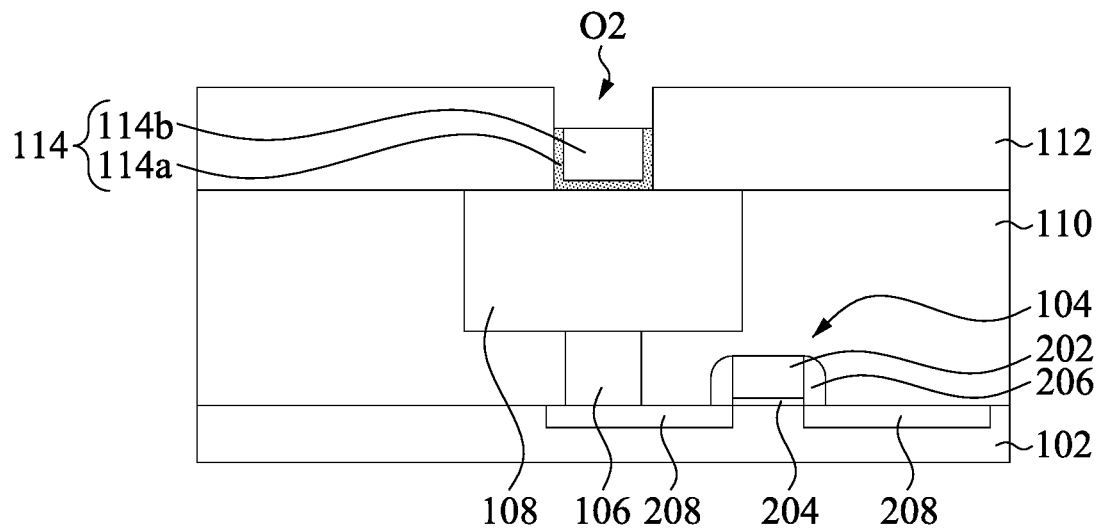

As shown in cross-sectional view of FIG. 2C, the bottom electrode 114 is etched back to form an opening O2, such that the opening O2 exposes the sidewalls of the dielectric layer 112. In some embodiments, the bottom electrode 114 can be etched back using suitable process, such as wet etching, dry etching, or combinations thereof. The etchant used in the etching back process etches the bottom electrode 114 at a faster etch rate than it etches the dielectric layer 112, so as to form the opening O2 in the dielectric layer 112.

Figure 2D:
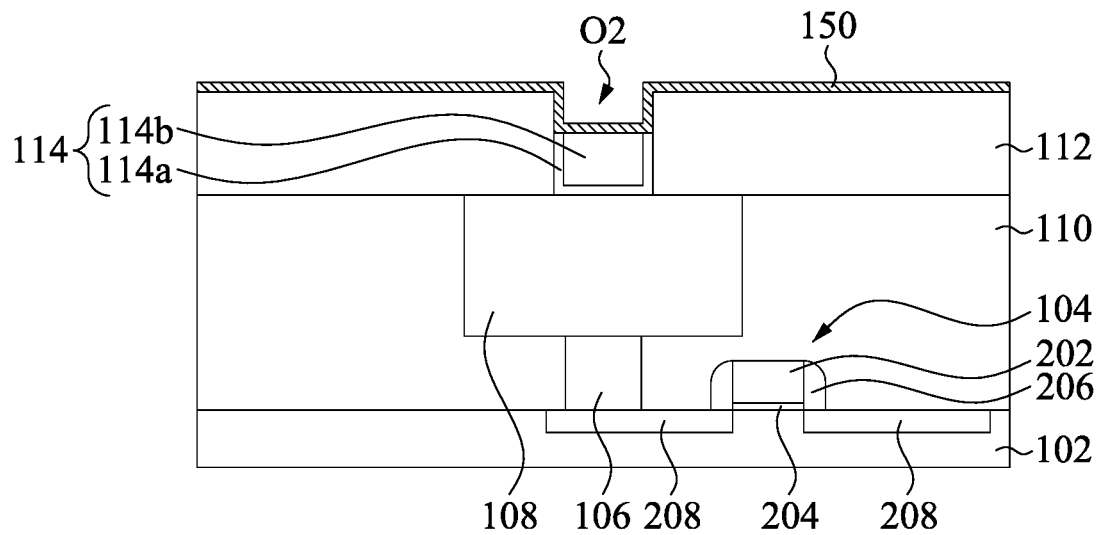

As shown in cross-sectional view of FIG. 2D, a first 2-D material layer 150 is formed in the opening O2 and over the top surface of the dielectric layer 112. The thickness of the first 2-D material layer 150 can be as low as the thickness of a single molecule layer. In some embodiments, the thickness of first 2-D material layer 150 is in a range from about 0.7 nm to about 3.5 nm.

The first 2-D material layer 150 can include suitable 2-D material, such as thin layers of graphene, graphene analogues, phosphorene, boron nitride, or TMDs. The first 2-D material layer 150 can be formed using suitable deposition methods, including but not limited to epitaxial growth, atomic layer deposition (ALD), CVD, PEVCD, molecular beam epitaxy (MBE), or metal deposition with subsequent chemical reaction. In some embodiments, forming the first 2-D material layer 150 can include a Langmuir-Blodgett process. In some embodiments, forming the first 2-D material layer 150 can include deposition processes and subsequent annealing processes to improve the material quality by increasing the domain size and reducing the defects. More details on the deposition of 2-D material for the first 2-D material layer 150 are discussed below.

Using a graphene-containing 2-D material for example, the first 2-D material layer 150 can be formed by epitaxial graphene growth. In some embodiments, a silicon carbide layer is used as a seed layer to promote the epitaxial growth of the graphene on the dielectric layer 112 and the bottom electrode 114. Another exemplary technique for forming the first 2-D material layer 150 utilizes ALD or CVD directly on the dielectric layer 112 and the bottom electrode 114. Surface treatments such as plasma or chemical treatment can be used to promote adherence of the first 2-D material layer 150 to the bottom electrode 114 and the dielectric layer 112. A thin liner layer can be deposited to promote adherence of the 2-D material, according to some embodiments. For example, a metal film can be deposited prior to the deposition of the first 2-D material layer 150. A metal carbide is formed by reacting the metal film with silicon carbide. The metal carbide is then annealed to produce a metal silicide and graphene from the remaining carbon. In some embodiments, graphene can be formed on a separate backing material and adhered to the dielectric layer 112 and the bottom electrode 114, followed by removing the backing material while leaving the graphene on the dielectric layer 112 and the bottom electrode 114. In some embodiments, graphene is deposited using an aqueous solution of graphene oxide.

Using black phosphorus for example, the first 2-D material layer 150 can be formed using atomic layer deposition (ALD). As one example, orthorhombic black phosphorus can be grown by a short-way transport reaction from red phosphorus and tin and/or tin-iodide as a mineralization additive. In another example, black phosphorus can be synthesized from white phosphorus under high pressure (e.g., about 12,000-14,000 kg/cm$^2$) at a temperature within a range of about 200-250 degrees Celsius. The thickness of the 2-D material can be controlled by the deposition time.

Using hexagonal boron nitride (h-BN, e.g., hexagonal BN) for example, the first 2-D material layer 150 can be formed using the ALD or CVD processes. Boron nitride is a wide band gap III-V compound with remarkable physical properties and chemical stability. Hexagonal BN (h-BN) includes alternating boron and nitrogen atoms in a honeycomb arrangement, including sp2-bonded two-dimensional (2-D) layers. Each layer of hexagonal BN includes boron and nitrogen atoms that are bound by strong covalent bonds, whereas the layers are held together by weak van der Waals forces, as in graphite. Accordingly, h-BN films can be peeled off from bulk BN crystal by micromechanical cleavage. Few-layer hexagonal BN has also been made by ultrasonication and high-energy electron beam irradiation of BN particles.

Figure 2E:
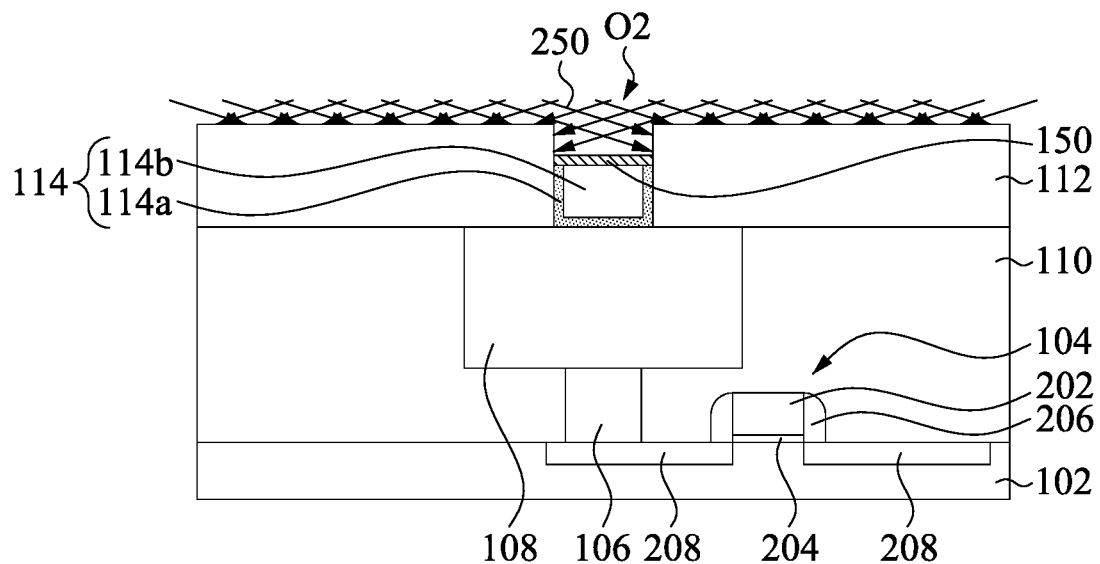
Figure 2F:
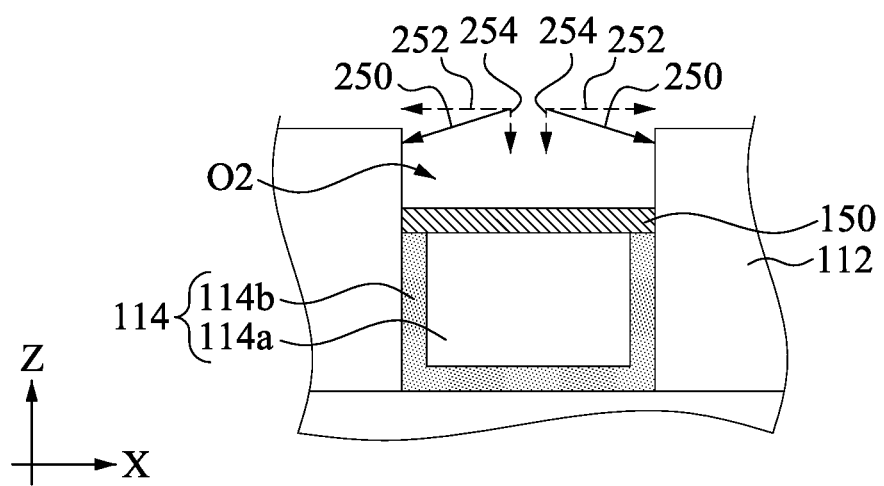

As shown in cross-sectional views of FIGS. 2E and 2F, the first 2-D material layer 150 is partially removed by an etching process, while leaving a portion of the first 2-D material layer 150 on the top surface of the bottom electrode 114. In some embodiments, the etching process is a directional etching process to remove the portions of the first 2-D material layer 150 over the top surface of the dielectric layer 112 and sidewalls of the opening O2, but not remove the portion of the first 2-D material layer 150 at the bottom of the opening O2 using the shadowing effect.

The etching process may include dry etch, wet etch or both. For example, the etching process may be a reactive ion etching (RIE) process. The directional etching process may be achieved by adjusting the angle of the ion beams that is used to remove portions of the first 2-D material layer 150. As illustrated in FIG. 2E, ion beams 250 are tilted away (slanted) from the perpendicular to the substrate 102. The ion beams 250 attack the portions of first 2-D material layer 150 over the top surface of the dielectric layer 112 and sidewalls of the opening O2, while the portion of the first 2-D material layer 150 at the bottom of the opening O2 is shadowed by the dielectric layer 112, such that the first 2-D material layer 150 remains on the top surface of the bottom electrode 114.

Referring to FIG. 2F, FIG. 2F is an enlarged view of FIG. 2E to further describe the directional etching process. The ion beams 250 are tilted away (slanted) from the direction Z, and have effective horizontal components 252 (i.e., along the direction X) and effective vertical components 254 (i.e., along the direction Z). The ion beams 250 may include argon ions in some embodiments. The substrate may be mounted on a wafer chuck and scanned along the X direction, the Y direction, or another direction perpendicular to the Z direction. The ion beams 250 remain at the same angle (or angular distribution) while the wafer stage is moved.

Figure 2G:
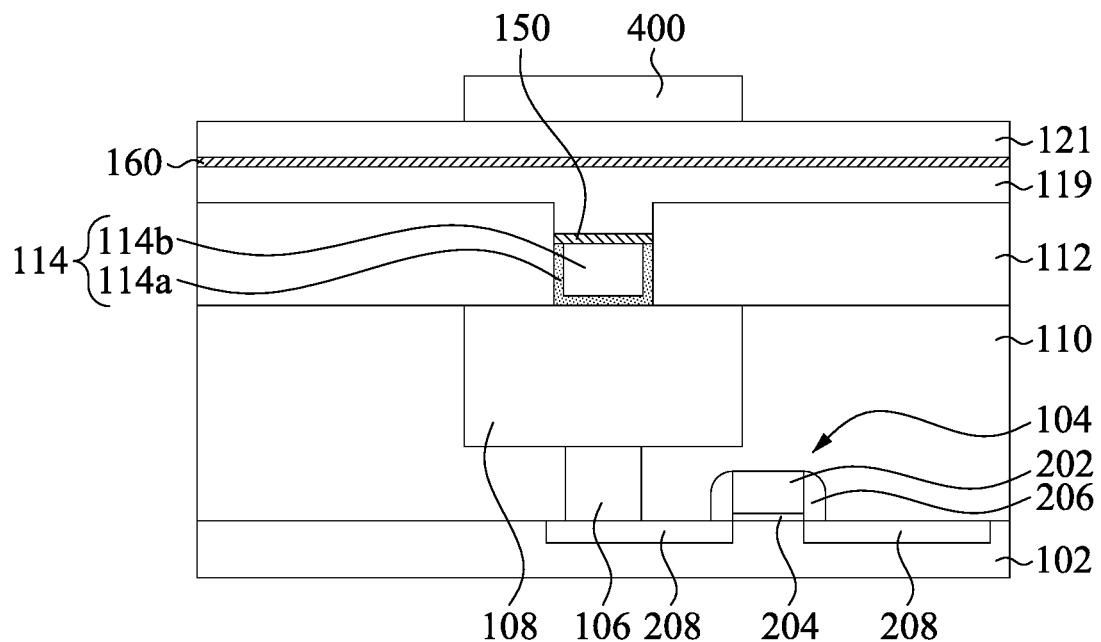

As shown in cross-sectional views of FIG. 2G, a phase change material layer 119, a second 2-D material layer 160, and a top electrode layer 121 are formed in sequence over the dielectric layer 112 and first 2-D material layer 150. In some embodiments, the phase change material layer 119 may be formed by suitable deposition process, such as CVD, PVD, ALD, or the like. In some embodiments, the top electrode layer 121 may be formed by suitable deposition process, such as CVD, PVD, ALD, or the like. The second 2-D material layer 160 may include similar material and formation method as those of the first 2-D material layer 150. Then, a patterned mask 400 is formed over the top electrode layer 121, in which the patterned mask 400 defines the position of the PCM cell (e.g., the PCM cell 116a in FIG. 1). The patterned mask 400 may be formed using suitable photolithography techniques. In some embodiments, a CMP process may be performed after depositing the phase change material layer 119 and before forming the second 2-D material layer 160, so that the second 2-D material layer 160 can be formed on a substantially flat surface.

Figure 2H:
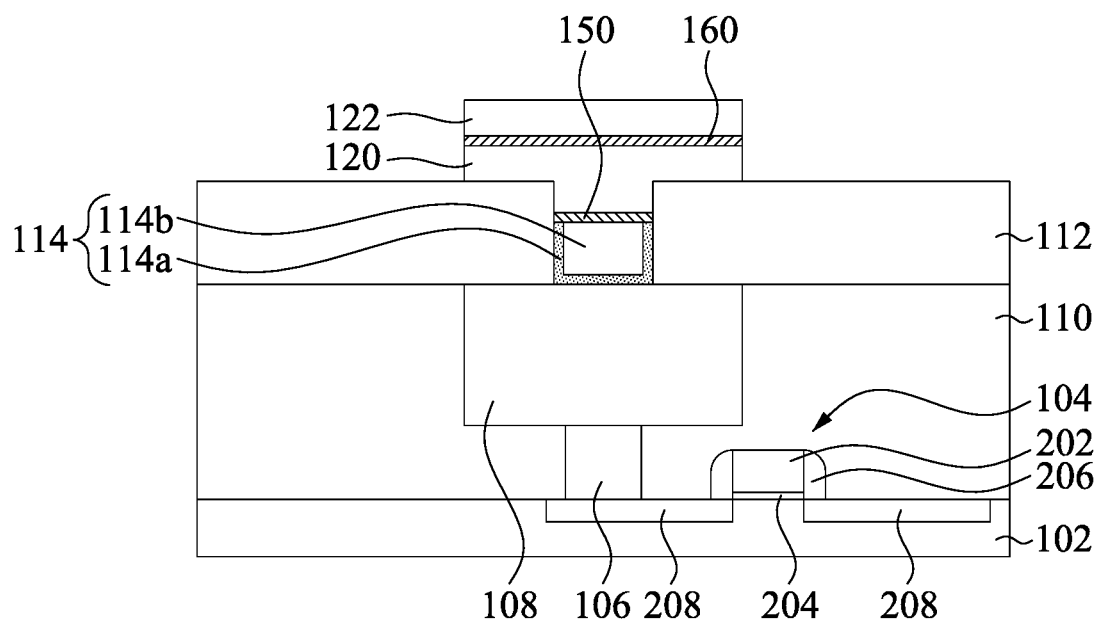

As shown in cross-sectional view of FIG. 2H, the phase change material layer 119, the second 2-D material layer 160, and the top electrode layer 121 are patterned using the patterned mask 400 as an etch mask. In some embodiments, an etching process is performed to remove portions of the phase change material layer 119, portions of the second 2-D material layer 160, and portions of the top electrode layer 121 exposed by the patterned mask 400. Stated another way, the etching process is performed by exposing the phase change material layer 119, the second 2-D material layer 160, and the top electrode layer 121 uncovered by the patterned mask 400 to an etchant of the etching process. After the etching process, the patterned mask 400 can be removed by suitable process, such as ashing. After the etching process, the remaining phase change material layer 119 is referred to as the PCE 120, and the remaining top electrode layer 121 is referred to as the top electrode 122. In some embodiments, the sidewall of the PCE 120, the sidewall of the second 2-D material layer 160, and the sidewall of the top electrode 122 are substantially vertically aligned with each other.

Figure 2I:
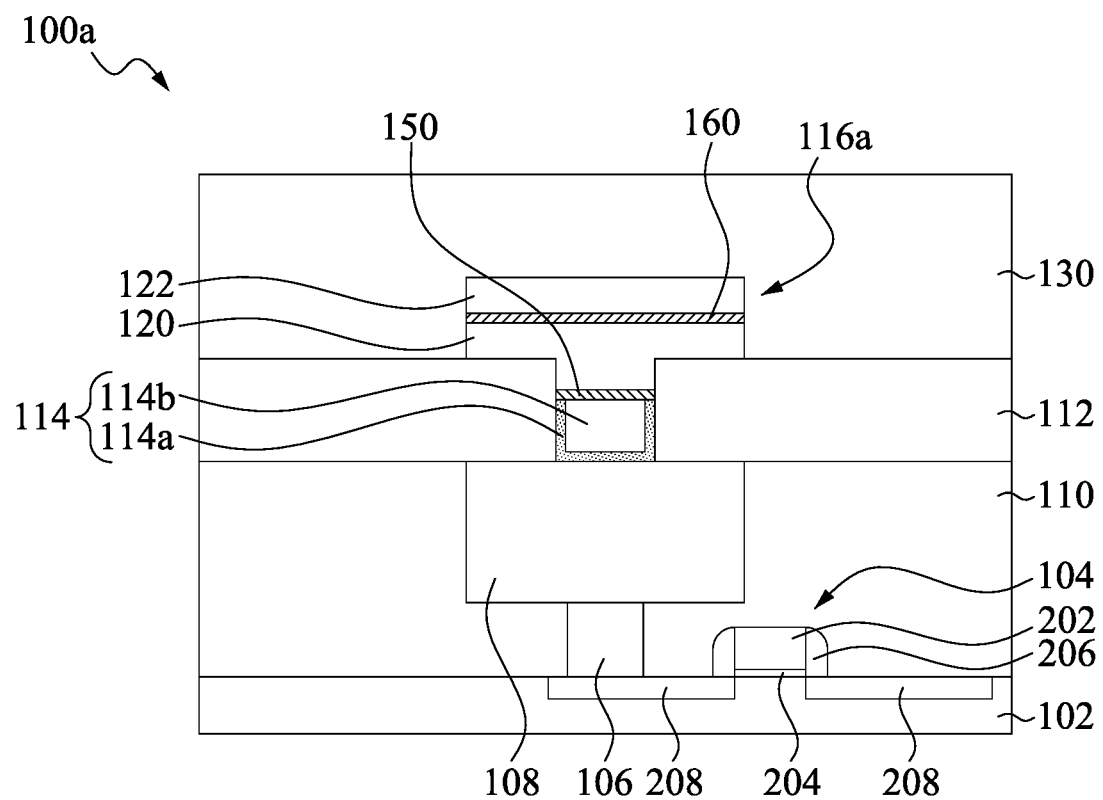

As shown in cross-sectional view of FIG. 2I, a deposition process is performed to form the IMD layer 130 over the dielectric layer 112 and covering the PCE 120, the second 2-D material layer 160, and the top electrode 122. In some embodiments, the IMD layer 130 may be formed by suitable process, such as CVD, PVD, ALD, spin-on process, or the like.

Figure 2J:
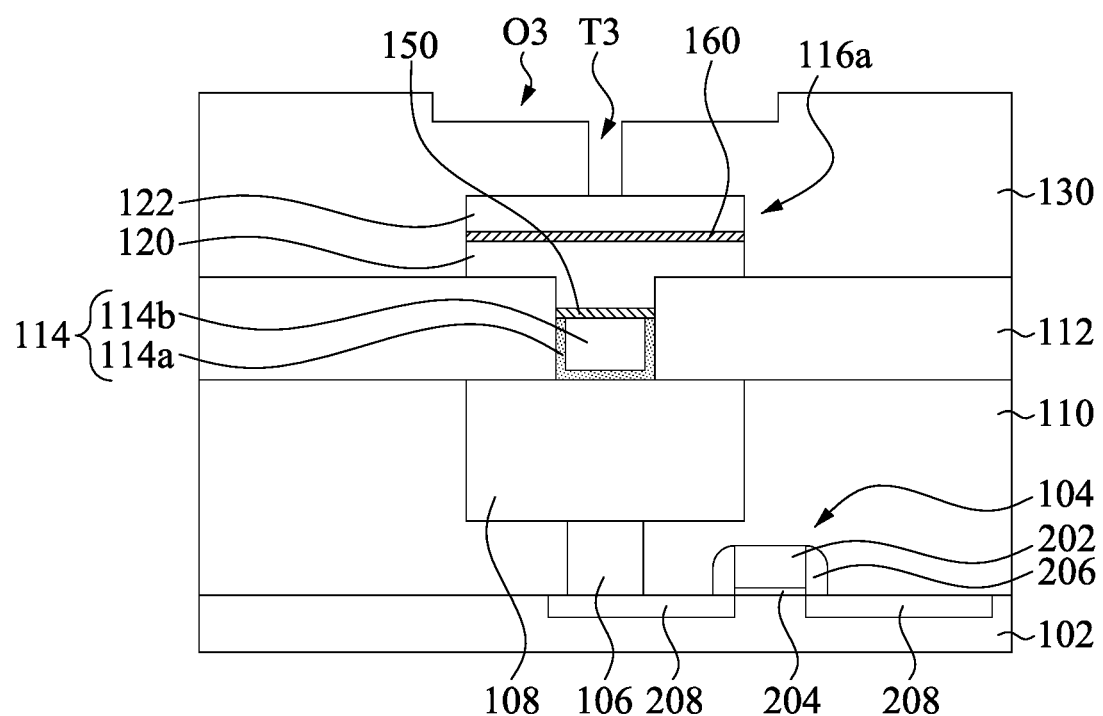

As shown in cross-sectional view of FIG. 2J, the IMD layer 130 is patterned to form a via opening O3 and a trench V3. The opening O3 exposes the top surface of the top electrode 122. In some embodiments, the via opening O3 and the trenches V3 may be formed in the IMD layer 130 using a dual damascene process.

Figure 2K:
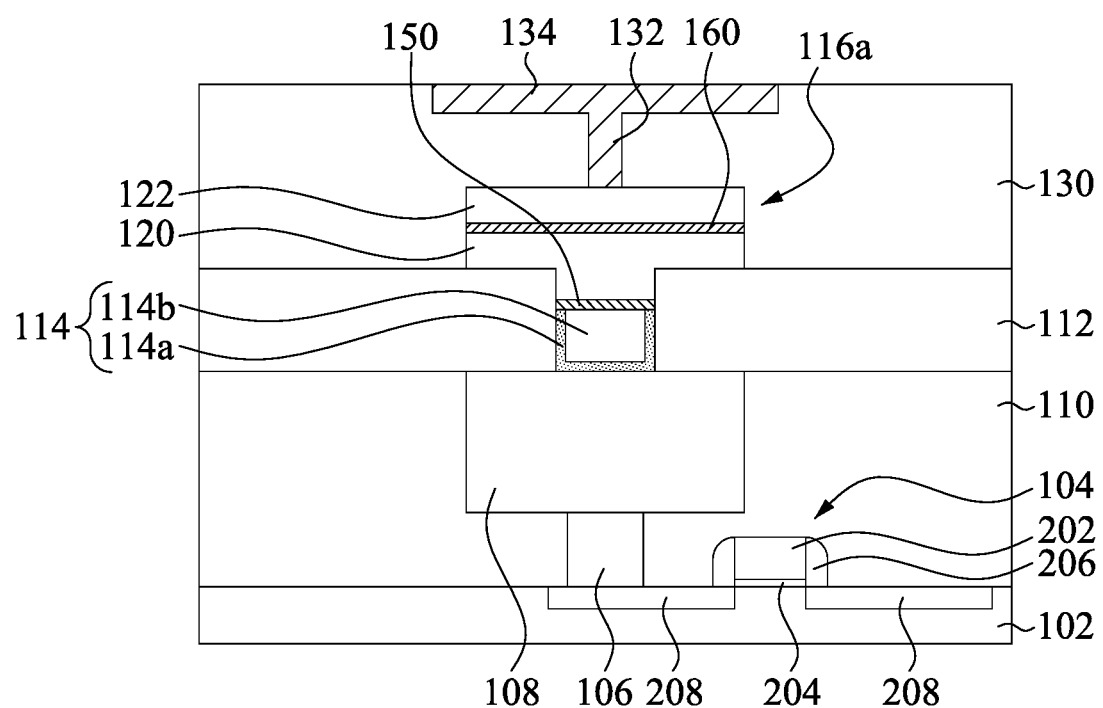

As shown in cross-sectional view of FIG. 2K, a conductive via 132 and a conductive wire 134 are formed respectively in the via opening O3 and the trench T3. In some embodiments, a deposition process is performed to deposit one or more conductive layers to overfill the via opening O3 and trench T3, and followed by one or more CMP process(es) to remove excessive conductive material until the IMD layer 130 is exposed. In some embodiments, the conductive via 132 and the upper conductive wire 134 may have no distinguishable interface therebetween, if they are deposited is a same deposition process as discussed above.

Figure 3:
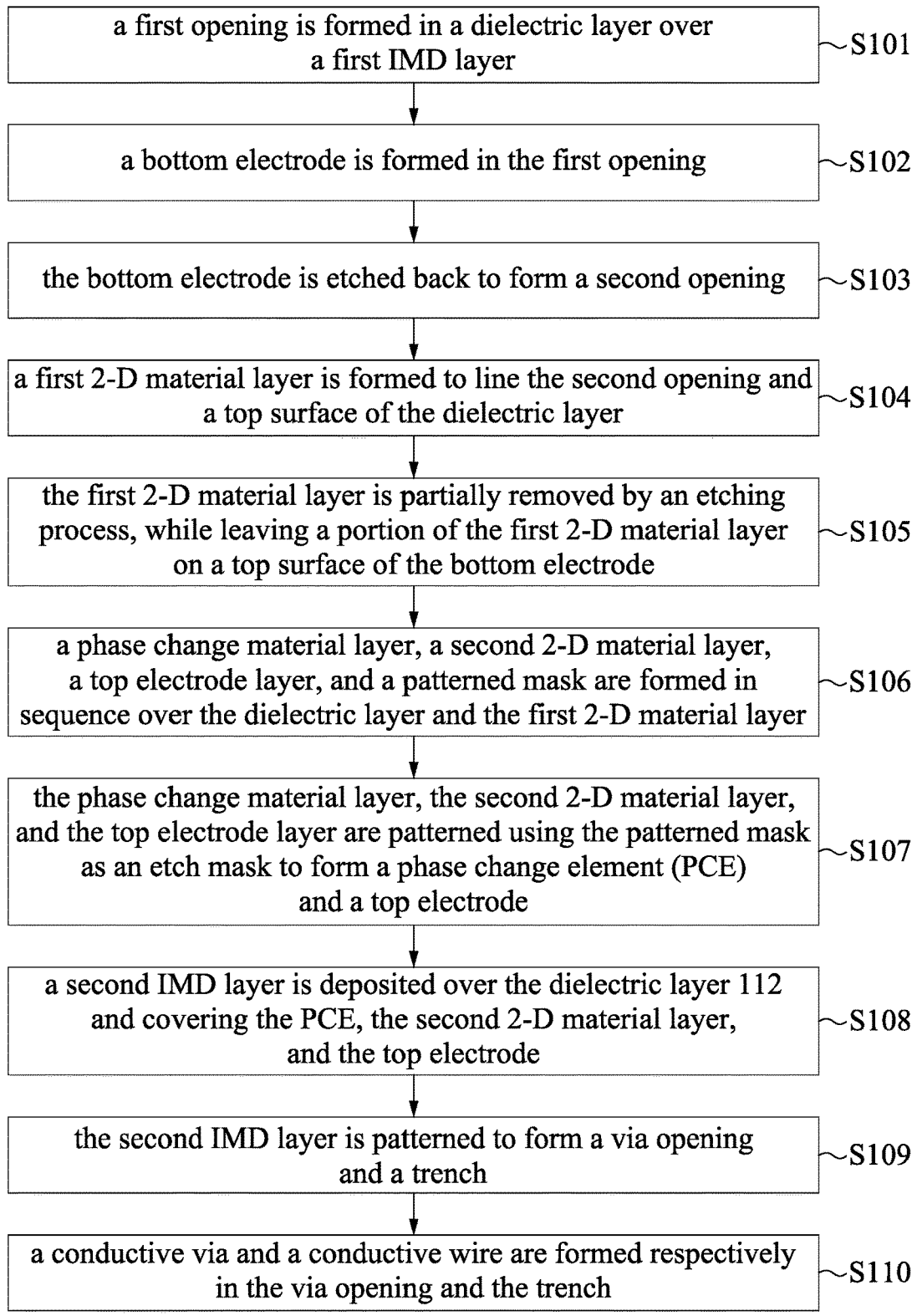
FIG. 3 illustrates a method of forming a memory device in accordance with some embodiments of the present disclosure.

FIG. 3 illustrates a method M1 of forming a memory device in accordance with some embodiments. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a first opening is formed in a dielectric layer over a first IMD layer. FIG. 2A illustrates a cross-sectional view of some embodiments corresponding to act in block S101.

At block S102, a bottom electrode is formed in the first opening. FIG. 2B illustrates a cross-sectional view of some embodiments corresponding to act in block S102.

At block S103, the bottom electrode is etched back to form a second opening. FIG. 2C illustrates a cross-sectional view of some embodiments corresponding to act in block S103.

At block S104, a first 2-D material layer is formed to line the second opening and a top surface of the dielectric layer. FIG. 2D illustrates a cross-sectional view of some embodiments corresponding to act in block S104.

At block S105, the first 2-D material layer is partially removed by an etching process, while leaving a portion of the first 2-D material layer on a top surface of the bottom electrode. FIGS. 2E and 2F illustrate a cross-sectional view of some embodiments corresponding to act in block S105.

At block S106, a phase change material layer, a second 2-D material layer, and a top electrode layer are formed in sequence over the dielectric layer and the first 2-D material layer. FIG. 2G illustrates a cross-sectional view of some embodiments corresponding to act in block S106.

At block S107, the phase change material layer, the second 2-D material layer, and the top electrode layer are patterned using the patterned mask as an etch mask to form a phase change element (PCE) and a top electrode. FIG. 2H illustrates a cross-sectional view of some embodiments corresponding to act in block S107.

At block S108, a second IMD layer is deposited over the dielectric layer 112 and covering the PCE, the second 2-D material layer, and the top electrode. FIG. 2I illustrates a cross-sectional view of some embodiments corresponding to act in block S108.

At block S109, the second IMD layer is patterned to form a via opening and a trench. FIG. 2J illustrates a cross-sectional view of some embodiments corresponding to act in block S109.

At block S110, a conductive via and a conductive wire are formed respectively in the via opening and the trench. FIG. 2K illustrates a cross-sectional view of some embodiments corresponding to act in block S110.

Figure 4A:
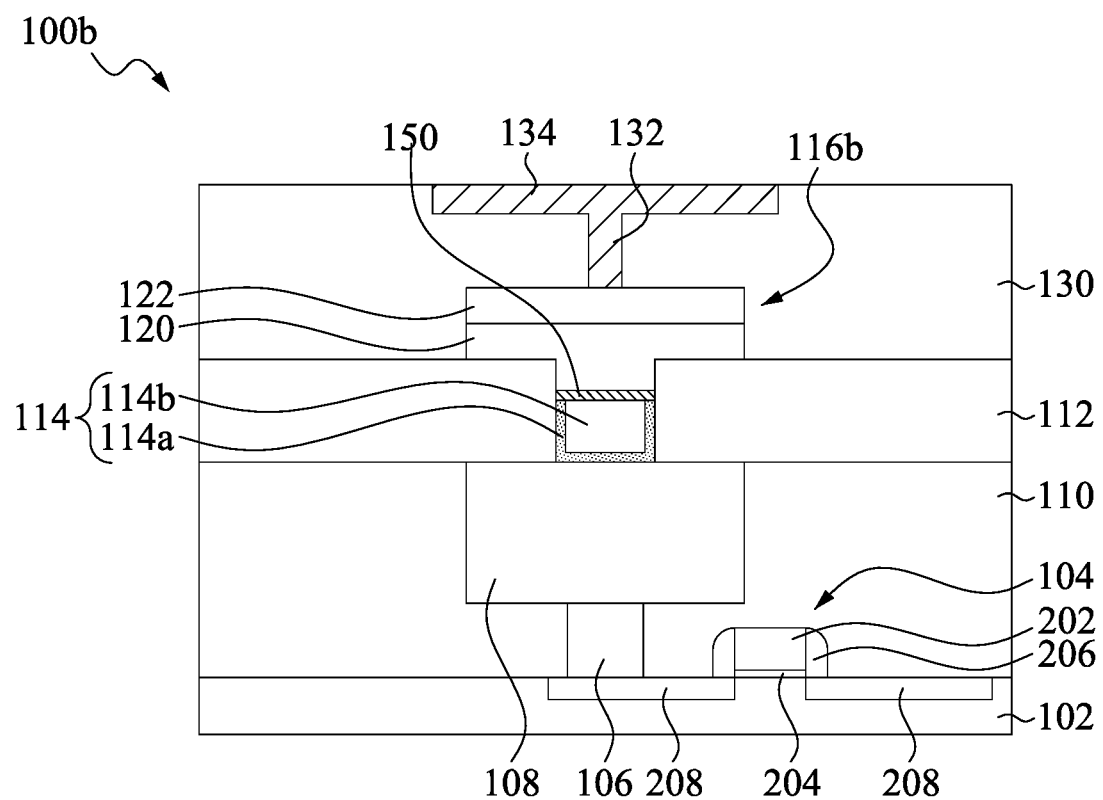
FIG. 4A is a cross-sectional view of memory devices in according to some embodiments of the present disclosure.

FIG. 4A shows a different embodiment of the present disclosure. Some elements in FIG. 4A are the same or similar to those described with respect to FIG. 1, and thus relevant structural details will not be repeated hereinafter.

Reference is made to FIG. 4A, shown there is a memory device 100b including a PCM cell 116b. Different from the memory device 100a in FIG. 1, the second 2-D material layer 160 in FIG. 1 is omitted in the PCM cell 116b in FIG. 4A, such that the top electrode 122 is in direct contact with the PCE 120. During forming the memory device 100b, the deposition process of the second 2-D material layer 160 as described in FIG. 2G can be skipped.

Figure 4B:
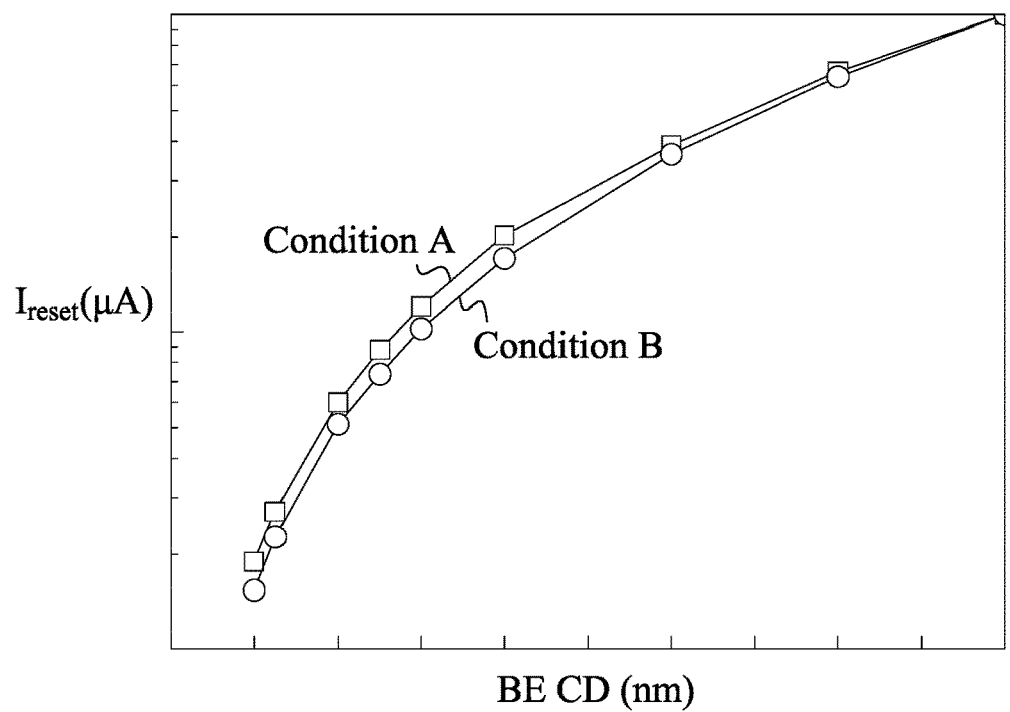
FIGS. 4B and 4C illustrate simulation results of reduction of reset current $I_{reset}$ of PCM cell by introducing a 2-D material layer in accordance with some embodiments.
Figure 4C:
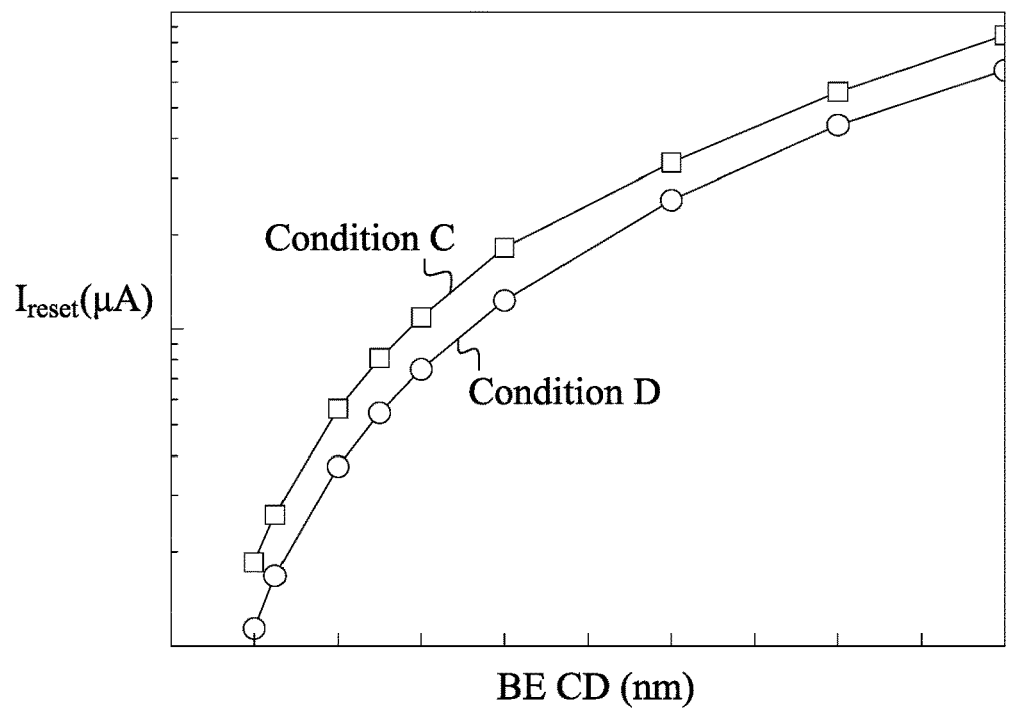

FIGS. 4B and 4C illustrate simulation results of reduction of reset current $I_{reset}$ of a PCM cell by using the 2-D material layer 150, in which the reset current $I_{reset}$ is shown on the vertical axis in FIGS. 4B and 4C, and the width of the bottom electrode (i.e., the bottom electrode 114 in FIG. 4A) is shown on the lateral axis in FIGS. 4B and 4C.

Reference is made to FIG. 4B. Conditions A and B illustrate simulation results of the memory device 100b in FIG. 4A. The difference between Conditions A and B is that Condition A is a simulation result of a PCRAM device without the first 2-D material layer 150, and Condition B is a simulation result a PCRAM device with the first 2-D material layer 150 made of graphene. Comparing Condition A with Condition B, it is clear that forming a graphene layer 150 between the bottom electrode 114 and the PCE 120 can reduce the reset current $I_{reset}$ of the PCRAM device.

Reference is made to FIG. 4C. Conditions C and D illustrate simulation results of the memory device 100b in FIG. 4A. The difference between Conditions C and D is that Condition C is a simulation result of a PCRAM device without the first 2-D material layer 150, and Condition D is a simulation result of a PCRAM device with the first 2-D material layer 150 made of MoS$_2$. Comparing Condition C with Condition D, it is clear that forming a MoS$_2$ layer 150 between the bottom electrode 114 and the PCE 120 can reduce the reset current I$_{reset}$ of the PCRAM device.

Figure 5:
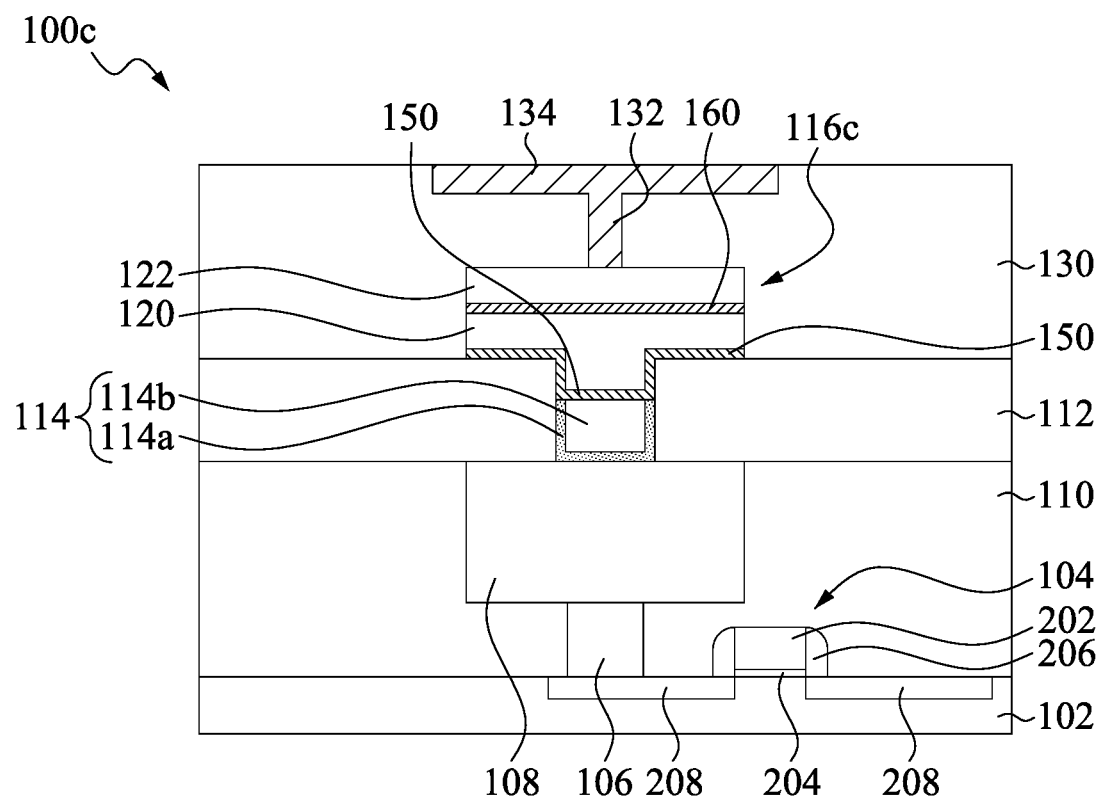
FIGS. 5, 6, and 7A are cross-sectional views of a memory device in according to some embodiments of the present disclosure.

Reference is made to FIG. 5, shown there is a memory device 100c including a PCM cell 116c. Different from the memory device 100a in FIG. 1, the first 2-D material layer 150 is disposed on the sidewalls of the dielectric layer 112 and the top surface of the dielectric layer 112, such that the PCE 120 is separated from the dielectric layer 112. Formation of the memory device 100c may skip the etching process as illustrated in FIG. 2E, and thus the first 2-D material layer 150 is patterned together with the PCE 120, the second 2-D material 160 and the top electrode 122 in the patterning process as illustrated in FIGS. 2G-2H. As a result, sidewalls of the first 2-D material layer 150 may be substantially aligned with sidewalls of the PCE 120, the second 2-D material layer 160 and the top electrode 122.

Figure 6:
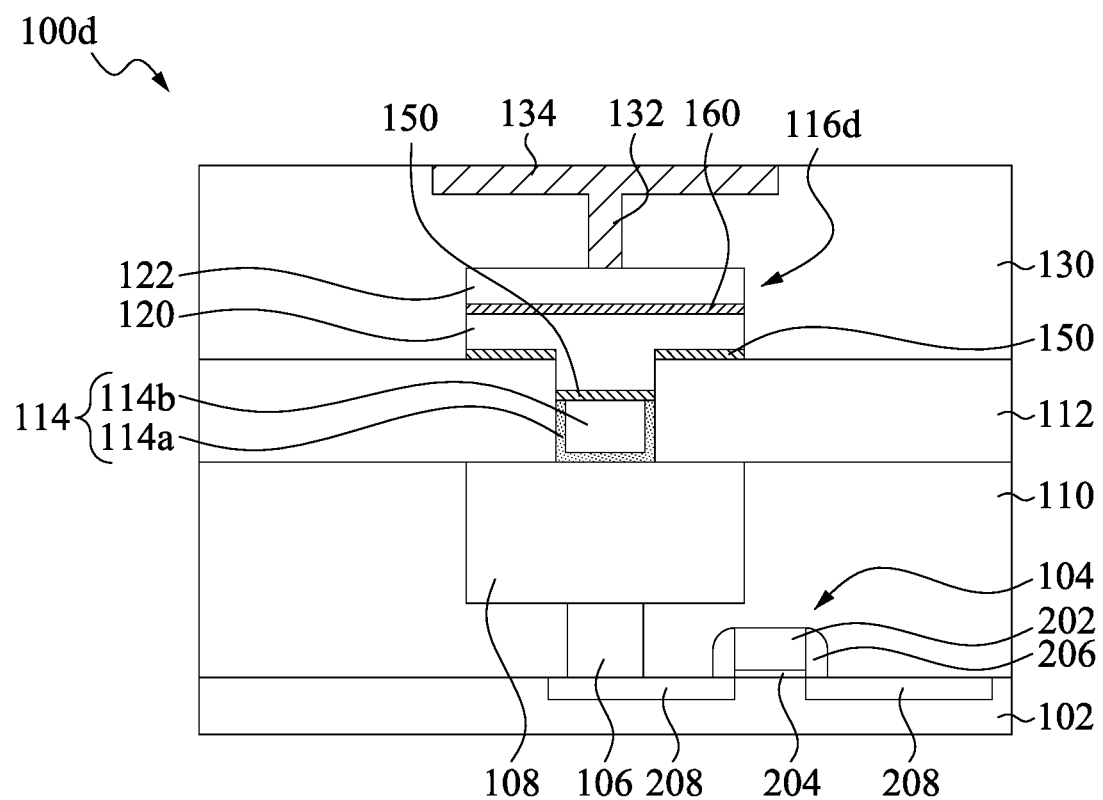

Reference is made to FIG. 6, shown there is a memory device 100d including a PCM cell 116d. Different from the memory device 100a in FIG. 1, the first 2-D material layer 150 is further disposed on the top surface of the dielectric layer 112, while leaving the sidewalls of the opening O2 (see FIG. 2C) free from coverage of the first 2-D material layer 150. As a result, the PCE 120 is separated from the top surface of the dielectric layer 112 but extending along the sidewalls of the dielectric layer 112. The discontinuous first 2-D material layer 150 can be formed by, for example, forming a continuous first 2-D material layer 150 over the dielectric layer 112 as illustrated in FIG. 2D, forming a patterned mask (e.g., photoresist) over a portion of the first 2-D material layer 150 over the top surface of the dielectric layer 112 while leaving a portion of the first 2-D material layer 150 in the opening O2 exposed, followed by performing a directional etching process as illustrated in FIG. 2E on the exposed portion of the first 2-D material layer to remove a portion of the first 2-D material layer from sidewalls of the dielectric layer 112. The patterned mask will be removed after performing the directional etching process. The discontinuous first 2-D material layer 150 is patterned together with the overlying PCE 120, the second 2-D material layer 160 and the top electrode 122, and thus their sidewalls are aligned with each other.

Figure 7A:
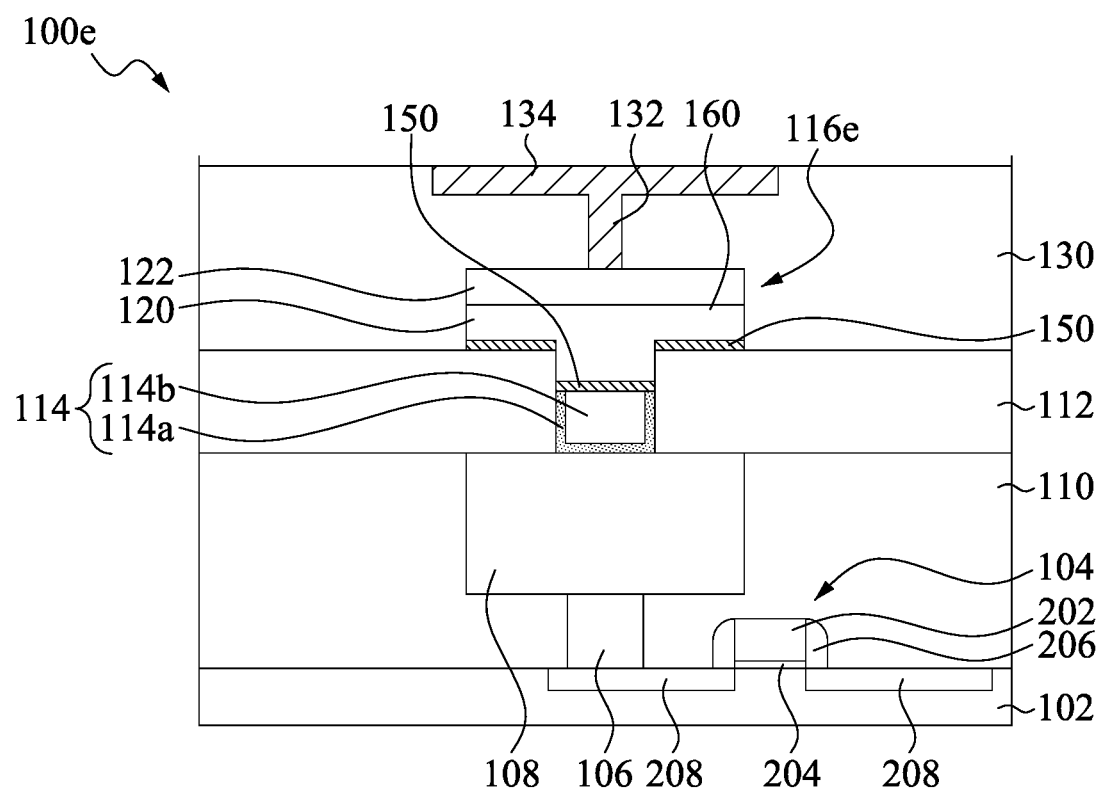

Reference is made to FIG. 7A, shown there is a memory device 100e including a PCM cell 116e. FIG. 7A is similar to FIG. 6, while the second 2-D material layer 160 in FIG. 6 is omitted in FIG. 7A.

Figure 7B:
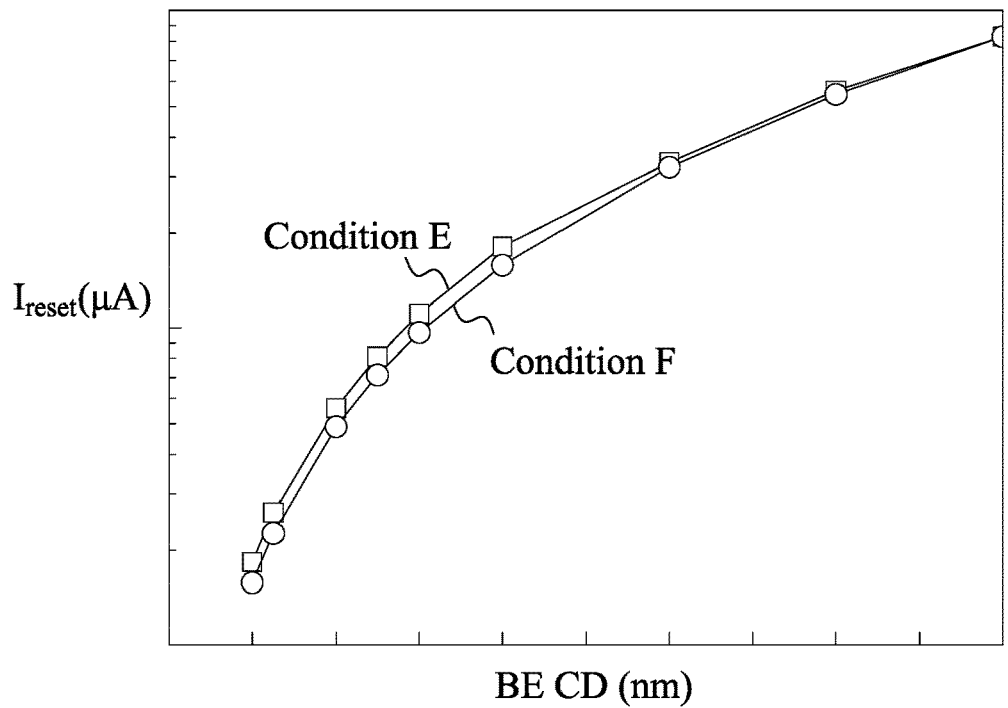
FIGS. 7B and 7C illustrate simulation results of reduction of reset current $I_{reset}$ of PCM cell by introducing a 2-D material layer in accordance with some embodiments.

Reference is made to FIG. 7B. Conditions E and F illustrate simulation results of the memory device 100e in FIG. 7A. The difference between Conditions E and F is that Condition E is a simulation result of a PCRAM device as shown in FIG. 7A but without the first 2-D material layer 150, and Condition F is a simulation result of the PCRAM device as shown in FIG. 7A with the first 2-D material layer 150 made of graphene. Comparing Condition E with Condition F, it is clear that forming a graphene layer 150 between the bottom electrode 114 and the PCE 120, and between the dielectric layer 112 and the PCE 120 can reduce the reset current I$_{reset}$ of the PCRAM device.

Figure 7C:
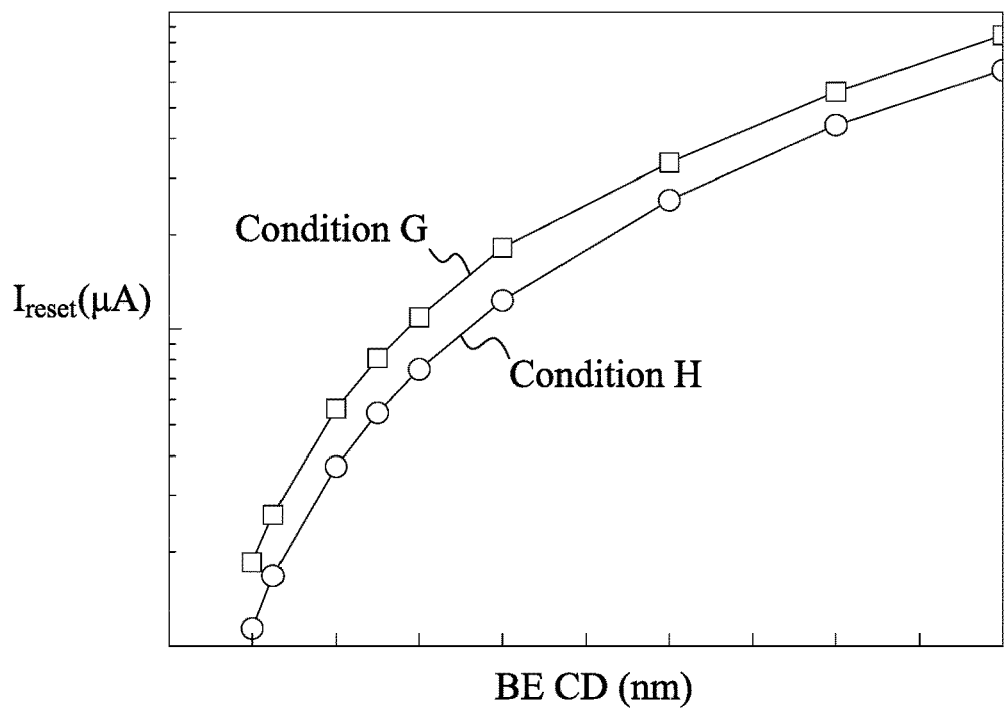

Reference is made to FIG. 7C. Conditions G and H illustrate simulation results of the memory device 100e in FIG. 7A. The difference between Conditions G and H is that Condition G is a simulation result of a PCRAM device as shown in FIG. 7A but without the first 2-D material layer 150, and Condition H is a simulation result of a PCRAM device as shown in FIG. 7A with the first 2-D material layer 150 made of MoS$_2$. Comparing Condition G with Condition H, it is clear that forming a MoS$_2$ layer 150 between the bottom electrode 114 and the PCE, and between the dielectric layer 112 and the PCE 120 can reduce the reset current I$_{reset}$ of the PCRAM device.

Figure 8:
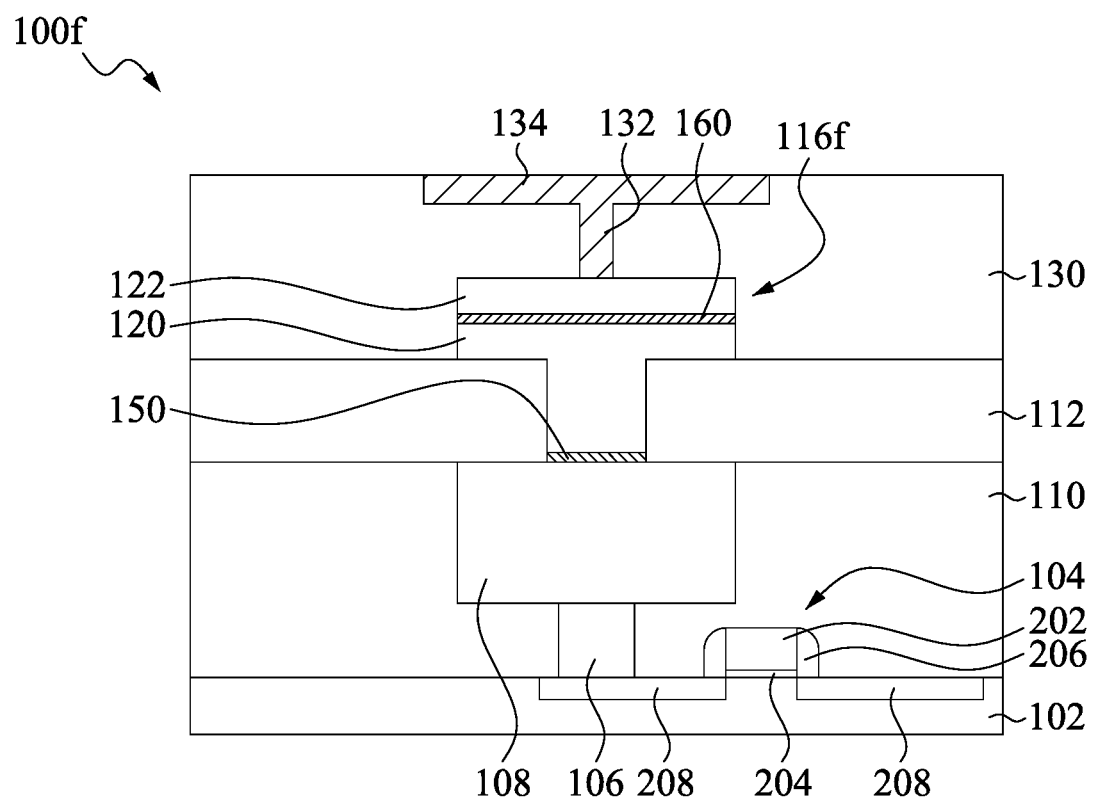
FIG. 8 is a cross-sectional view of memory devices in according to some embodiments of the present disclosure.

Referring to FIG. 8, a cross-sectional view of a memory device 100f including a PCM cell 116f in accordance with some embodiments is provided. Different from the memory device 100a in FIG. 1, the bottom electrode 114 in FIG. 1 is omitted in the memory device 100f of FIG. 8. As a result, the first 2-D material layer 150 extends along a surface of the conductive wire 108 proximal to the first 2-D material layer 150. Other elements in FIG. 8 are the same or similar to those described with respect to FIG. 1, and thus relevant structural details will not be repeated hereinafter for brevity.

FIGS. 9A to 9F illustrate cross-sectional views of some embodiments of a method of forming a memory device including a PCM structure according to the present disclosure. In greater details, FIGS. 9A to 9F illustrate a method for forming the memory device 100f described in FIG. 8.

Figure 9A:
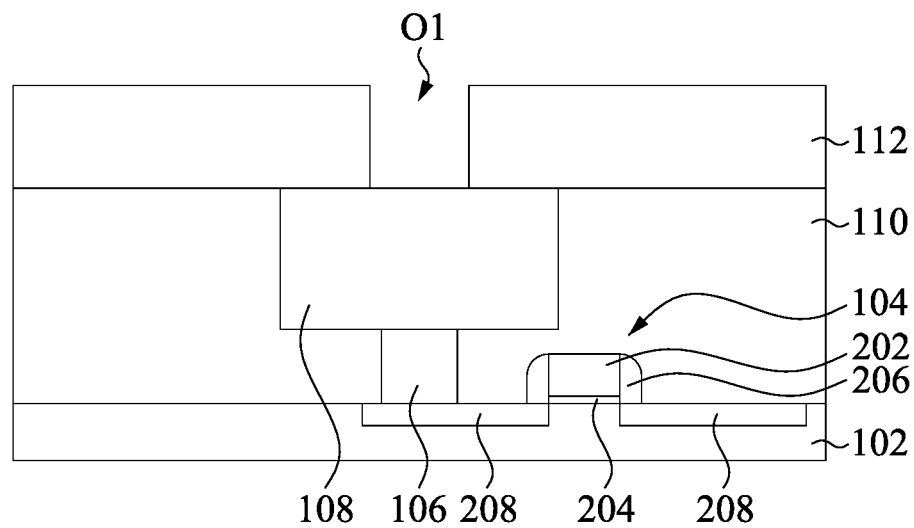
FIGS. 9A-9F are cross-sectional views of a memory device in various stages of fabrication in accordance with some embodiments of the present disclosure.

As shown in cross-sectional view of FIG. 9A, an initial structure includes the substrate 102, the bottom interconnect via 106, the IMD layer 110, the bottom conductive wire 108, and the dielectric layer 112. An opening O1 is formed in the dielectric layer 112 using suitable lithography and etching techniques. FIG. 9A is similar to FIG. 2A, and relevant structural details will not be repeated hereinafter for brevity.

Figure 9B:
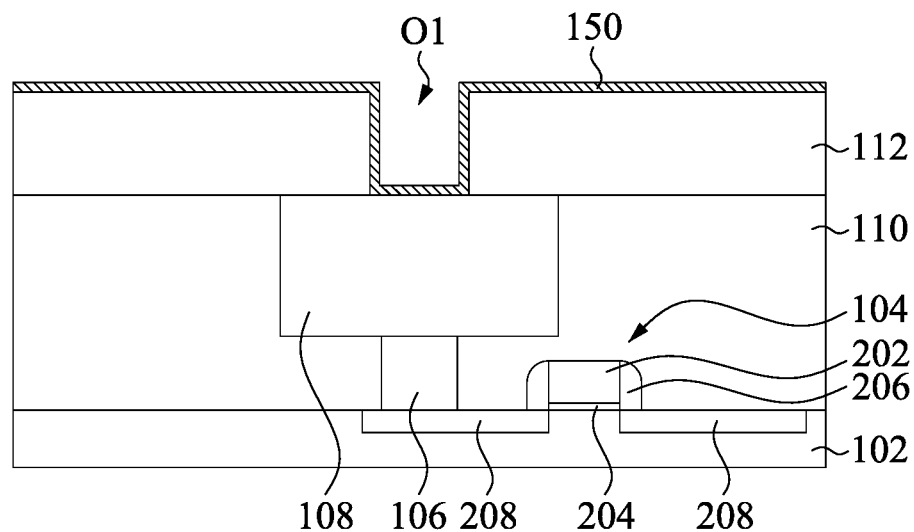

As shown in cross-sectional view of FIG. 9B, a first 2-D material layer 150 is formed in the opening O1 and over the top surface of the dielectric layer 112. Formation of the first 2-D material layer 150 is discussed in detail previously with respect to FIG. 2D, and thus is not repeated hereinafter for brevity.

Figure 9C:
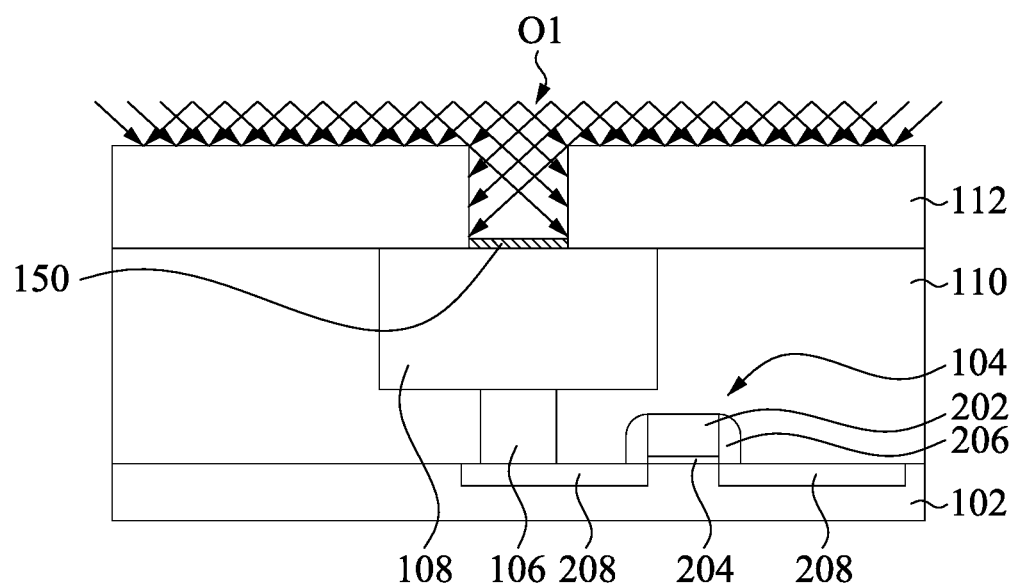

As shown in cross-sectional view of FIG. 9C, a directional etching process is performed to remove portions of the first 2-D material layer 150 from the top surface and the sidewalls of the dielectric layer 112, while leaving a portion of the first 2-D material layer 150 on the top surface of the bottom conductive wire 108. In some embodiments, the etching process is a directional etching process similar to those described in FIGS. 2E and 2F, and thus will not be repeated hereinafter for brevity.

Figure 9D:
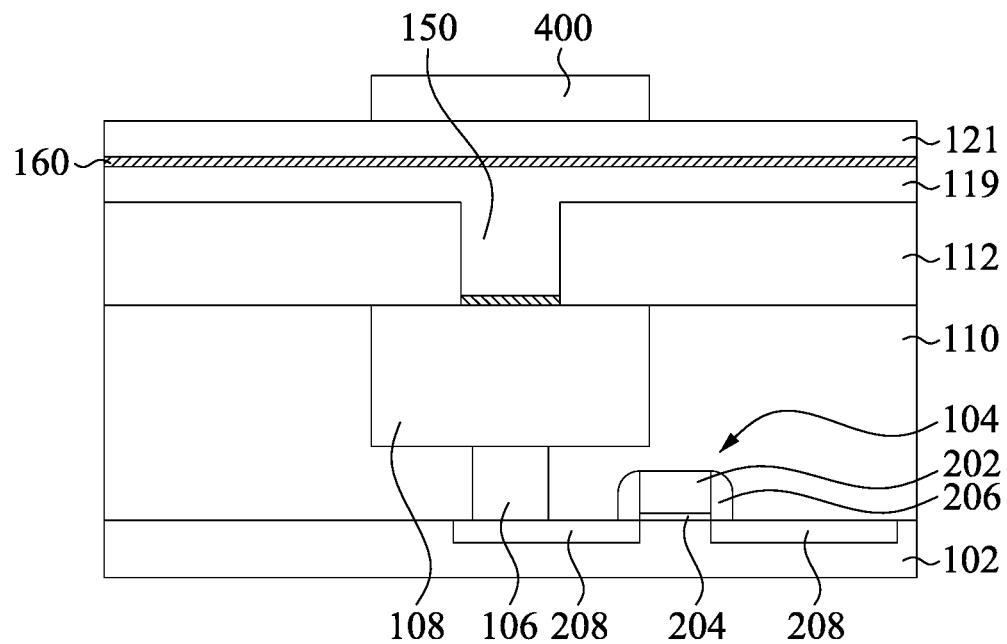

As shown in cross-sectional views of FIG. 9D, a phase change material layer 119, a second 2-D material layer 160, a top electrode layer 121, and a patterned mask 400 are formed over the dielectric layer 112 and the first 2-D material layer 150. Formation of these layers is similar to that described in FIG. 2G, and thus will not be repeated hereinafter for brevity.

Figure 9E:
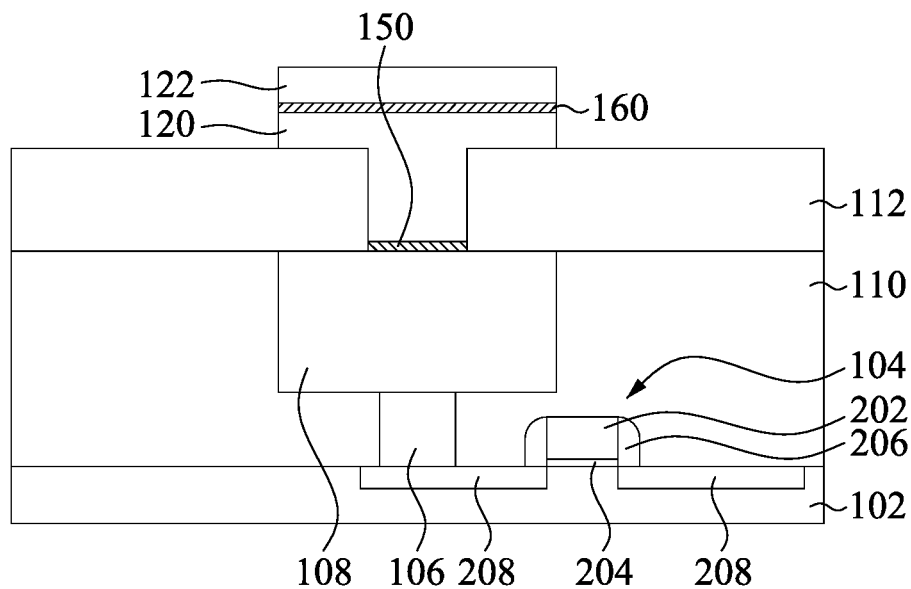

As shown in cross-sectional view of FIG. 9E, the phase change material layer 119, the second 2-D material layer 160, and the top electrode layer 121 are patterned using the patterned mask 400 as an etch mask. After the etching process, the patterned mask 400 can be removed by suitable process, such as ashing. After the etching process, the remaining phase change material layer 119 is referred to as the PCE 120, and the remaining top electrode layer 121 is referred to as the top electrode 122.

Figure 9F:
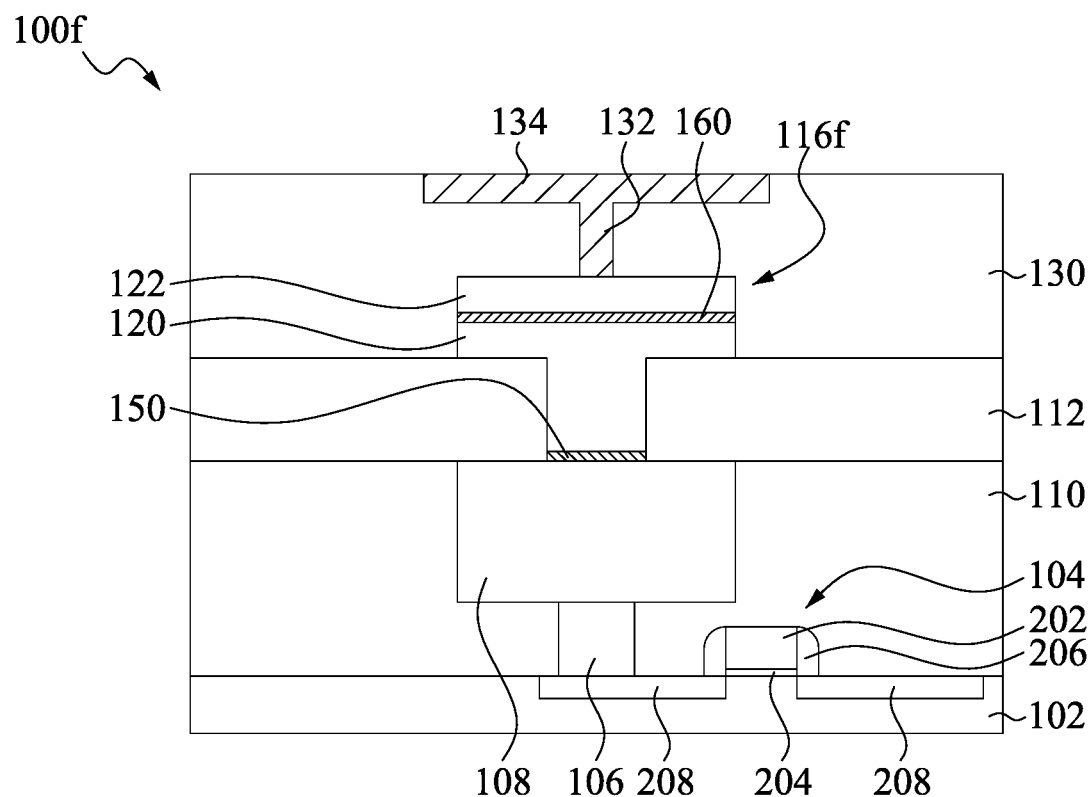

As shown in cross-sectional view of FIG. 9F, the IMD layer 130 is formed over the dielectric layer 112 and covering the PCE 120, the second 2-D material layer 160, and the top electrode 122, followed by forming the conductive via 132 and the upper conductive wire 134 in the IMD layer 130. Formation of these elements shown in FIG. 9F is the same or similar to that described in FIGS. 2I to 2K, and thus will not be repeated hereinafter for brevity.

Figure 10:
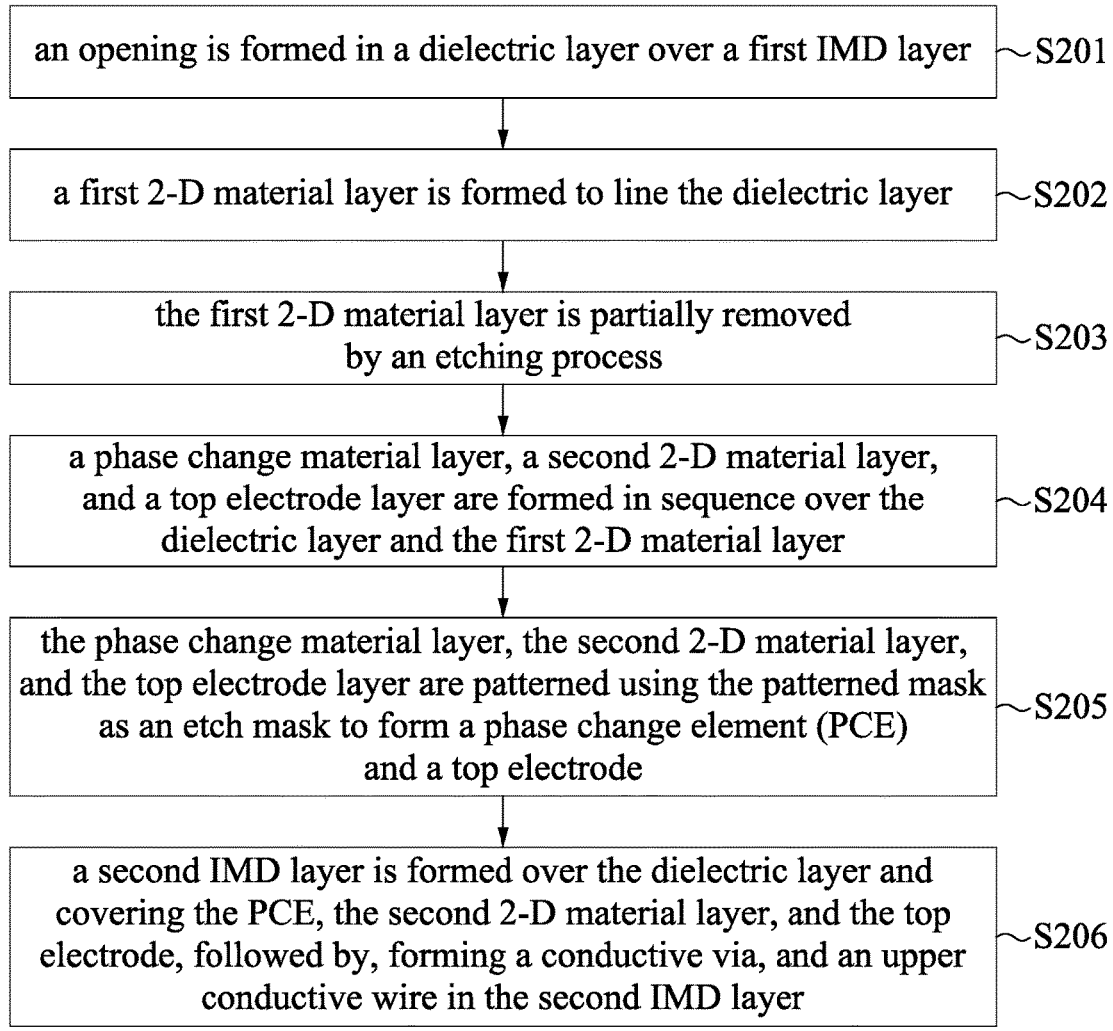
FIG. 10 illustrates a method of forming a memory device in accordance with some embodiments of the present disclosure.

FIG. 10 illustrates a method M2 of forming a memory device in accordance with some embodiments. Although the method M2 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may b e omitted, and other un-illustrated acts or events may be included.

At block S201, an opening is formed in a dielectric layer over a first IMD layer. FIG. 9A illustrates a cross-sectional view of some embodiments corresponding to act in block S201.

At block S202, a first 2-D material layer is formed to line the dielectric layer. FIG. 9B illustrates a cross-sectional view of some embodiments corresponding to act in block S202.

At block S203, the first 2-D material layer is partially removed by an etching process, while leaving a portion of the first 2-D material layer on the top surface of the bottom conductive wire. FIG. 9C illustrates a cross-sectional view of some embodiments corresponding to act in block S203.

At block S204, a phase change material layer, a second 2-D material layer, and a top electrode layer are formed in sequence over the dielectric layer and the first 2-D material layer. FIG. 9D illustrates a cross-sectional view of some embodiments corresponding to act in block S204.

At block S205, the phase change material layer, the second 2-D material layer, and the top electrode layer are patterned using the patterned mask as an etch mask to form a phase change element (PCE) and a top electrode. FIG. 9E illustrates a cross-sectional view of some embodiments corresponding to act in block S205.

At block S206, a second IMD layer is formed over the dielectric layer and covering the PCE, the second 2-D material layer, and the top electrode, followed by, forming a conductive via, and an upper conductive wire in the second IMD layer. FIG. 9F illustrates a cross-sectional view of some embodiments corresponding to act in block S206.

Figure 11:
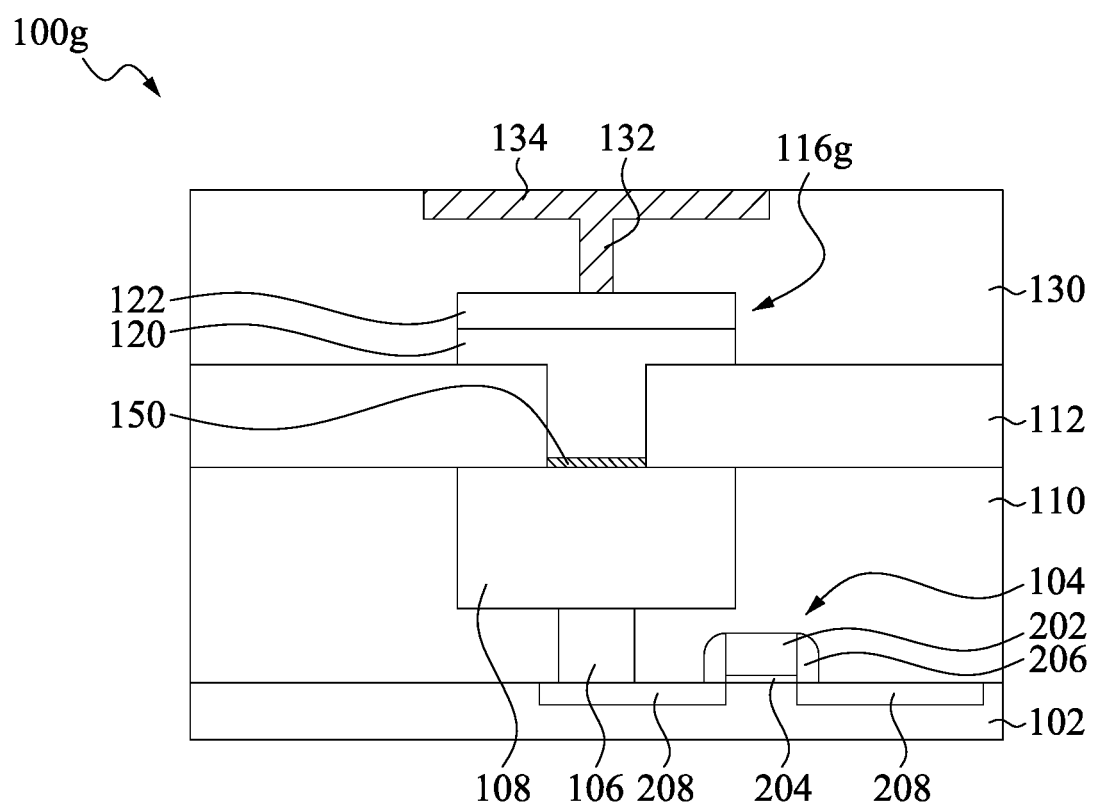
FIGS. 11-14 are cross-sectional views of memory devices in according to some embodiments of the present disclosure.
Figure 12:
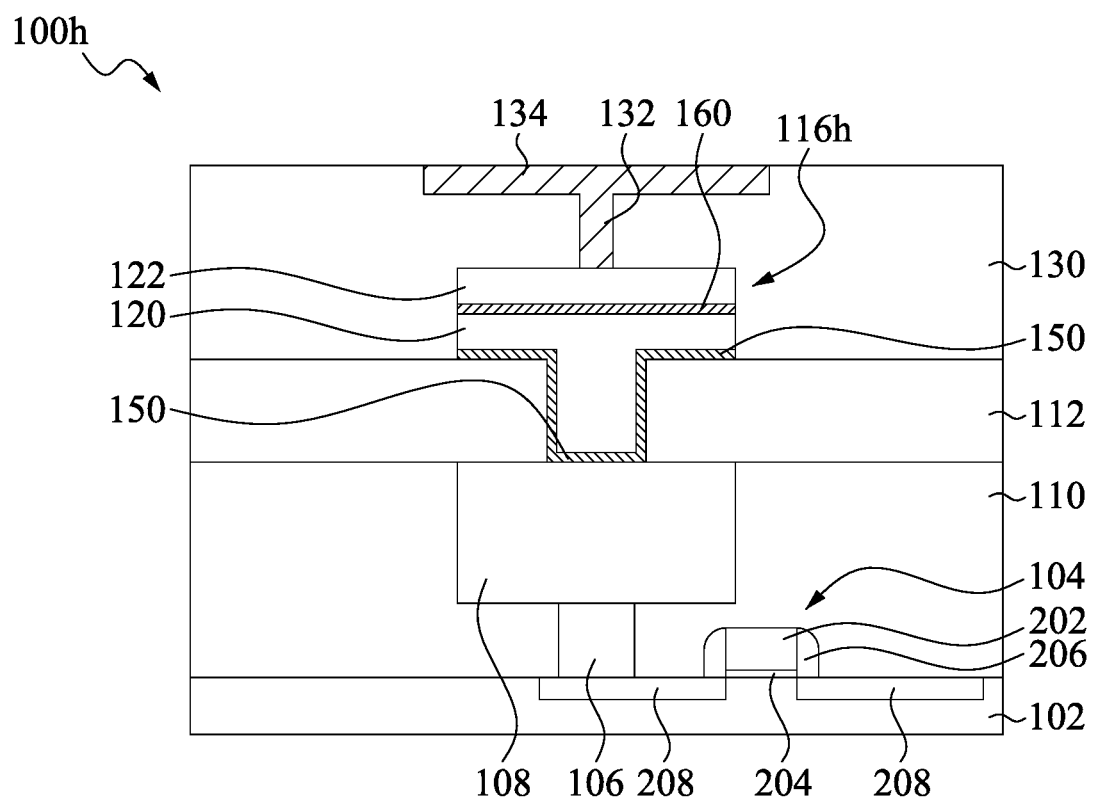
Figure 13:
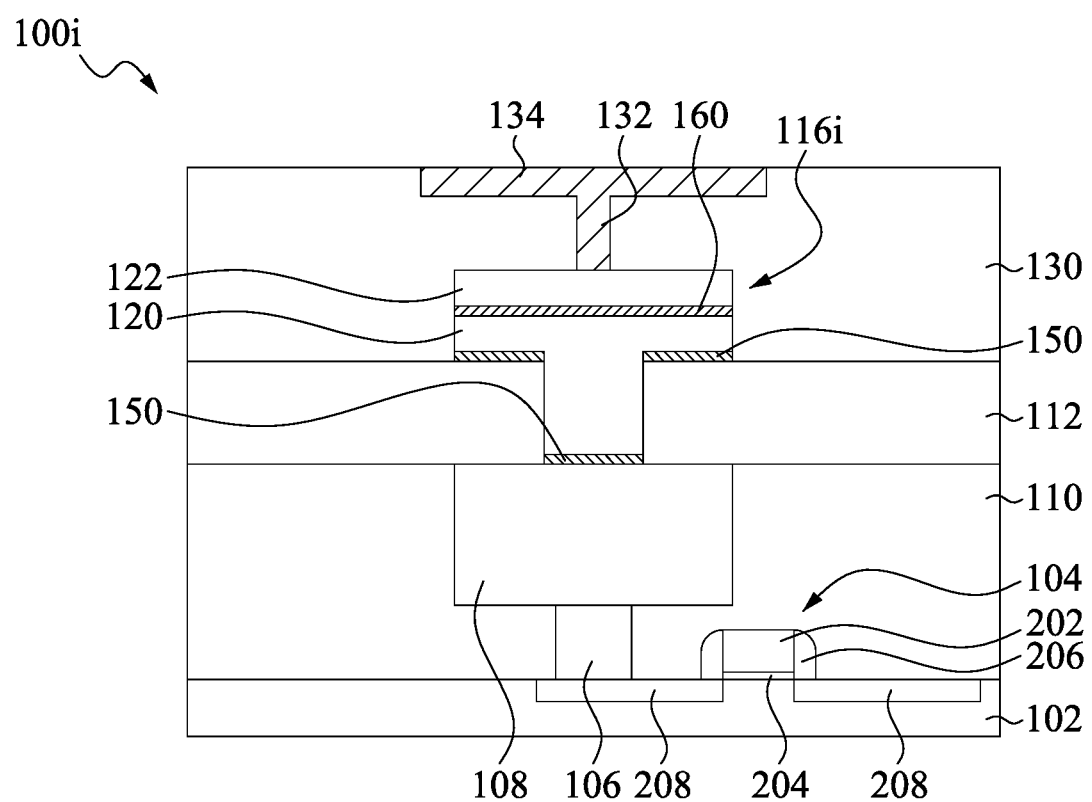

FIGS. 11-13 show different embodiments of the present disclosure. Some elements in FIGS. 11-13 are the same or similar to those described with respect to FIGS. 1 and 8, and thus relevant structural details will not be repeated hereinafter.

Reference is made to FIG. 11, shown there is a memory device 100g including a PCM cell 116g. Different from the memory device 100f in FIG. 8, the second 2-D material layer 160 in FIG. 8 is omitted in the PCM cell 116g in FIG. 11, such that the top electrode 122 is in direct contact with the PCE 120. During formation of the memory device 100g, the deposition process of the second 2-D material layer 160 as illustrated in FIG. 9D can be skipped.

Reference is made to FIG. 12, shown there is a memory device 100h including a PCM cell 116g. Different from the memory device 100f in FIG. 8, the first 2-D material layer 150 is on the sidewalls of the dielectric layer 112 and the top surface of the dielectric layer 112, such that the PCE 120 is separated from the dielectric layer 112. Formation of the memory device 100h may skip the etching process as illustrated in FIG. 9C, and thus the first 2-D material layer 150 is patterned together with the PCE 120, the second 2-D material 160 and the top electrode 122 in the patterning process as illustrated in FIGS. 9D-9E. As a result, sidewalls of the first 2-D material layer 150 may be substantially aligned with sidewalls of the PCE 120, the second 2-D material layer 160 and the top electrode 122.

Reference is made to FIG. 13, shown there is a memory device 100i including a PCM cell 116i. Different from the memory device 100f in FIG. 8, the first 2-D material layer 150 is disposed on the top surface of the dielectric layer 112, while leaving the sidewalls of the dielectric layer 112 free from coverage of the first 2-D material layer 150. As a result, the PCE 120 is separated from the top surface of the dielectric layer 112 but extending along the sidewalls of the dielectric layer 112. The discontinuous first 2-D material layer 150 can be formed by, for example, forming a continuous first 2-D material layer 150 over the dielectric layer 112 as illustrated in FIG. 9B, forming a patterned mask (e.g., photoresist) over a portion of the first 2-D material layer 150 over the top surface of the dielectric layer 112 while leaving a portion of the first 2-D material layer 150 in the opening O1 (see FIG. 9B) exposed, followed by performing a directional etching process as illustrated in FIG. 9C on the exposed portion of the first 2-D material layer to remove a portion of the first 2-D material layer from sidewalls of the dielectric layer 112. The patterned mask will be removed after performing the directional etching process. The discontinuous first 2-D material layer 150 is patterned together with the overlying PCE 120, the second 2-D material layer 160 and the top electrode 122, and thus their sidewalls are aligned with each other.

Figure 14:
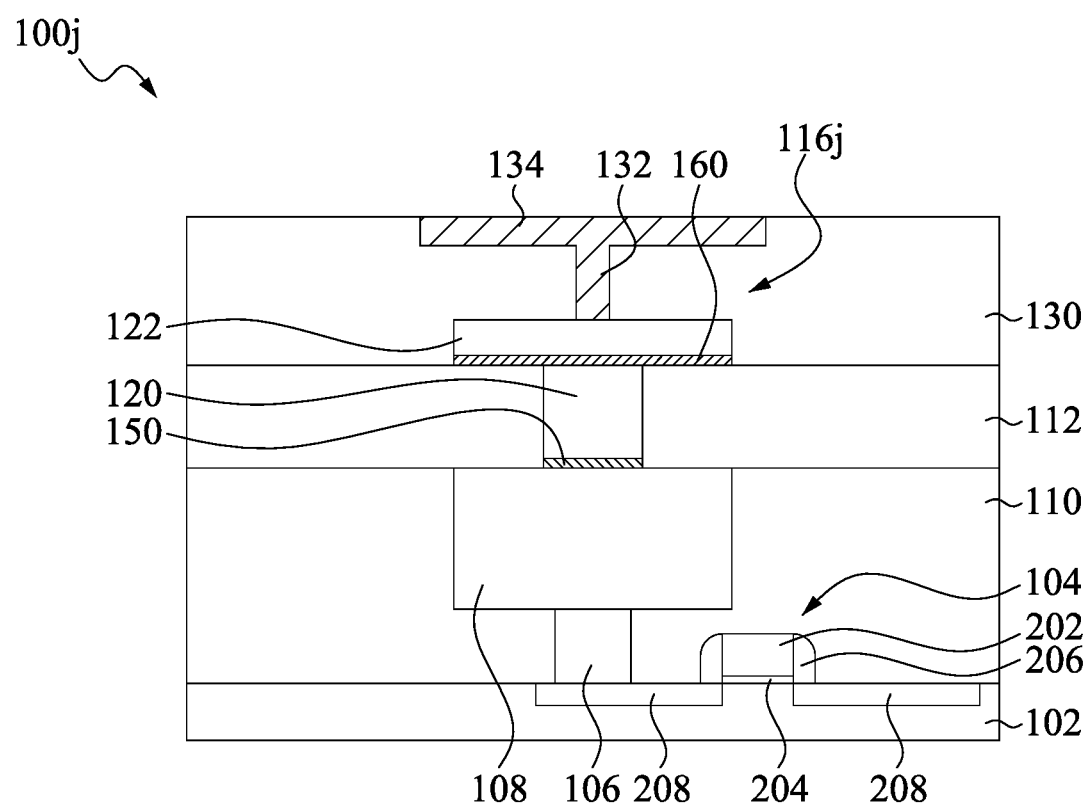

Referring to FIG. 14, a cross-sectional view of a memory device 100j including a PCM cell 116j in accordance with some embodiments is provided. Different from the memory device 100f in FIG. 8, the top surface of the PCE 120 and the top surface of the dielectric layer 112 are substantially coplanar, and the second 2-D material layer 160 in FIG. 14 extends along the top surface of the dielectric layer 112 and across the top surface of the PCE 120. In some embodiments, the second 2-D material layer 160 is wider than the PCE 120. Other elements in FIG. 14 are the same or similar to those described with respect to FIGS. 1 and 8, and thus relevant structural details will not be repeated hereinafter for brevity.

FIGS. 15A to 15F illustrate cross-sectional views of some embodiments of a method of forming a memory device including a PCM structure according to the present disclosure. In greater details, FIGS. 15A to 15F illustrate a method for forming the memory device 100j described in FIG. 14.

Figure 15A:
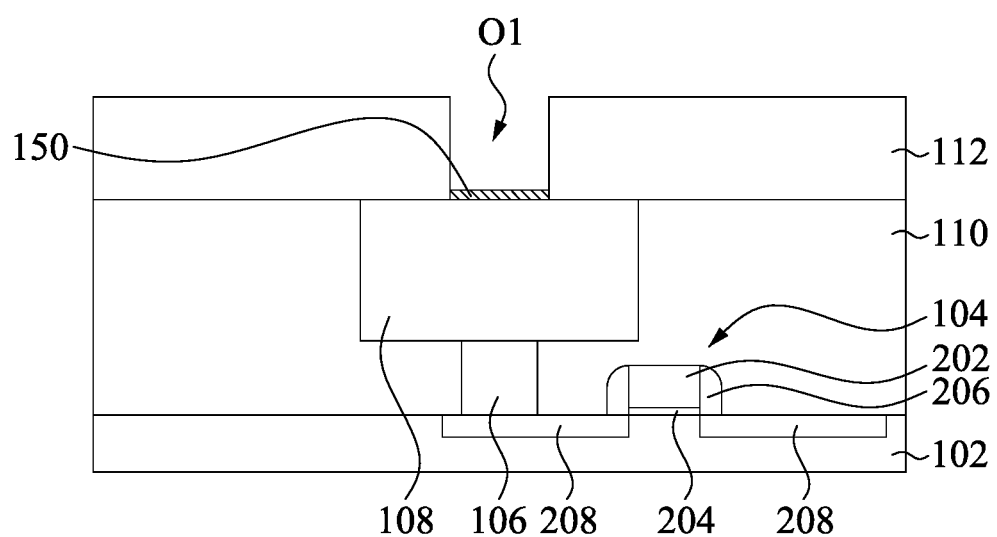
FIGS. 15A-15F are cross-sectional views of a memory device in various stages of fabrication in accordance with some embodiments of the present disclosure.

As shown in cross-sectional view of FIG. 15A, an initial structure includes the substrate 102, the bottom interconnect via 106, the IMD layer 110, the bottom conductive wire 108, the dielectric layer 112, and the first 2-D material layer 150. An opening O1 is formed in the dielectric layer 112 using suitable lithography and etching techniques. The first 2-D material layer 150 is formed in the opening O1 and extends along the top surface of the bottom conductive wire 108, while leaving the sidewalls of the opening O1 free from coverage of the first 2-D material layer 150. Formation of the first 2-D material layer 150 in FIG. 15A is similar to those described in FIGS. 2E and 2F and FIG. 9C, and thus is not repeated hereinafter for brevity.

Figure 15B:
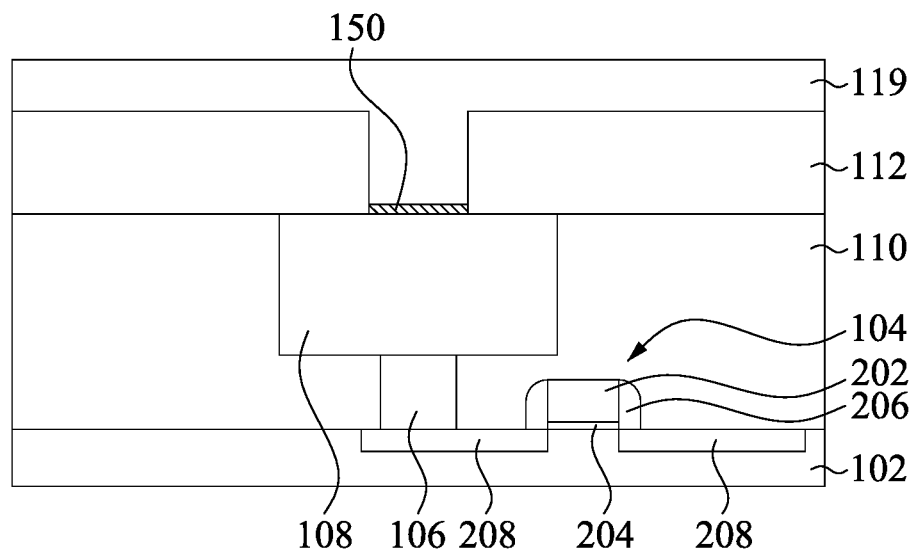

As shown in cross-sectional views of FIG. 15B, a phase change material layer 119 is formed to overfill the opening O1 and thus extends over the dielectric layer 112 (see FIG. 15A). Formation of the phase change material is similar to that described in FIG. 2G, and thus will not be repeated hereinafter for brevity.

Figure 15C:
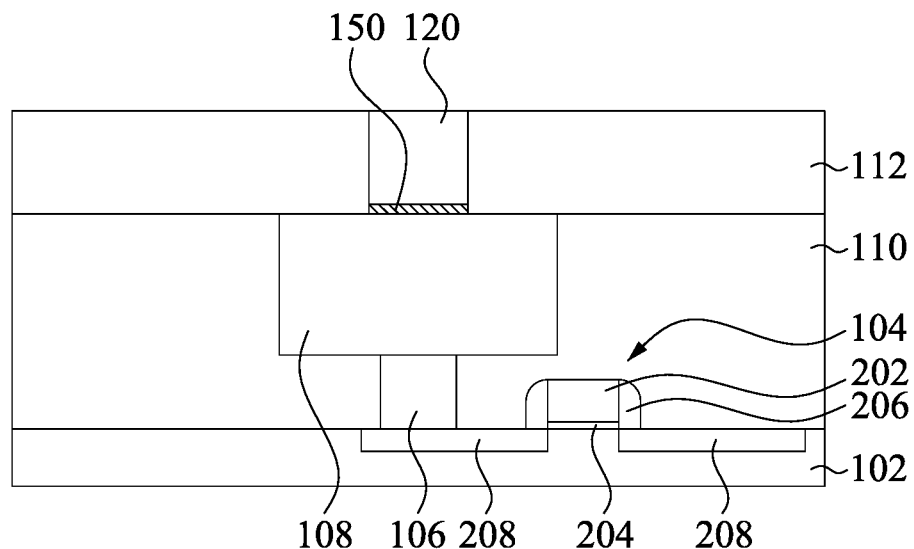

As shown in cross-sectional views of FIG. 15C, a CMP process is performed on the phase change material 119 until the top surface of the dielectric layer 112 is exposed. The CMP process substantially removes excessive material of the phase change material layer 119 above the dielectric layer 112 and outside the opening O1 (see FIG. 15A). After the CMP process, the top surface of the phase change material layer 119 and the top surface of the dielectric layer 112 are substantially coplanar. After the CMP process, the remaining phase change material layer 119 is referred to as PCE 120.

Figure 15D:
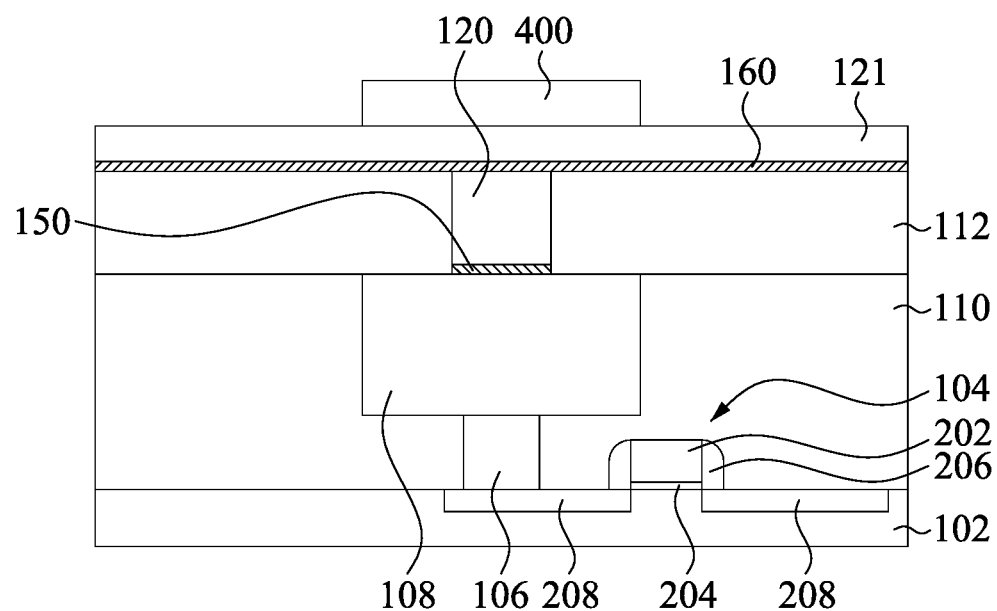

As shown in cross-sectional views of FIG. 15D, a second 2-D material layer 160, a top electrode layer 121, and a patterned mask 400 are formed in sequence over the dielectric layer 112 and the PCE 120. Formation of these layers is similar to that described in FIG. 2G, and thus will not be repeated hereinafter for brevity.

Figure 15E:
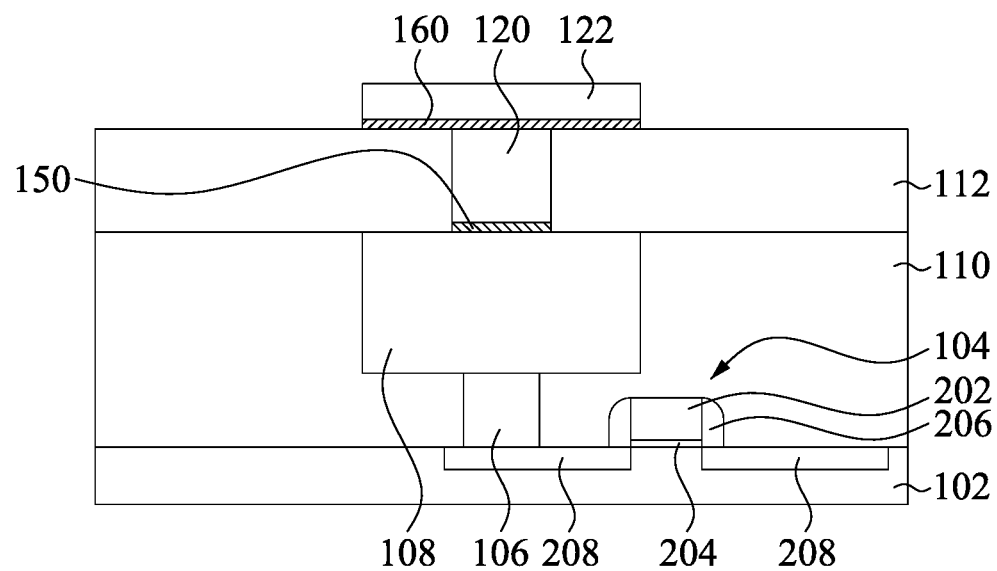

As shown in cross-sectional view of FIG. 15E, the second 2-D material layer 160 and the top electrode layer 121 are patterned using the patterned mask 400 as an etch mask. After the etching process, the patterned mask 400 can be removed by suitable process, such as ashing. After the etching process, the remaining top electrode layer 121 is referred to as the top electrode 122.

Figure 15F:
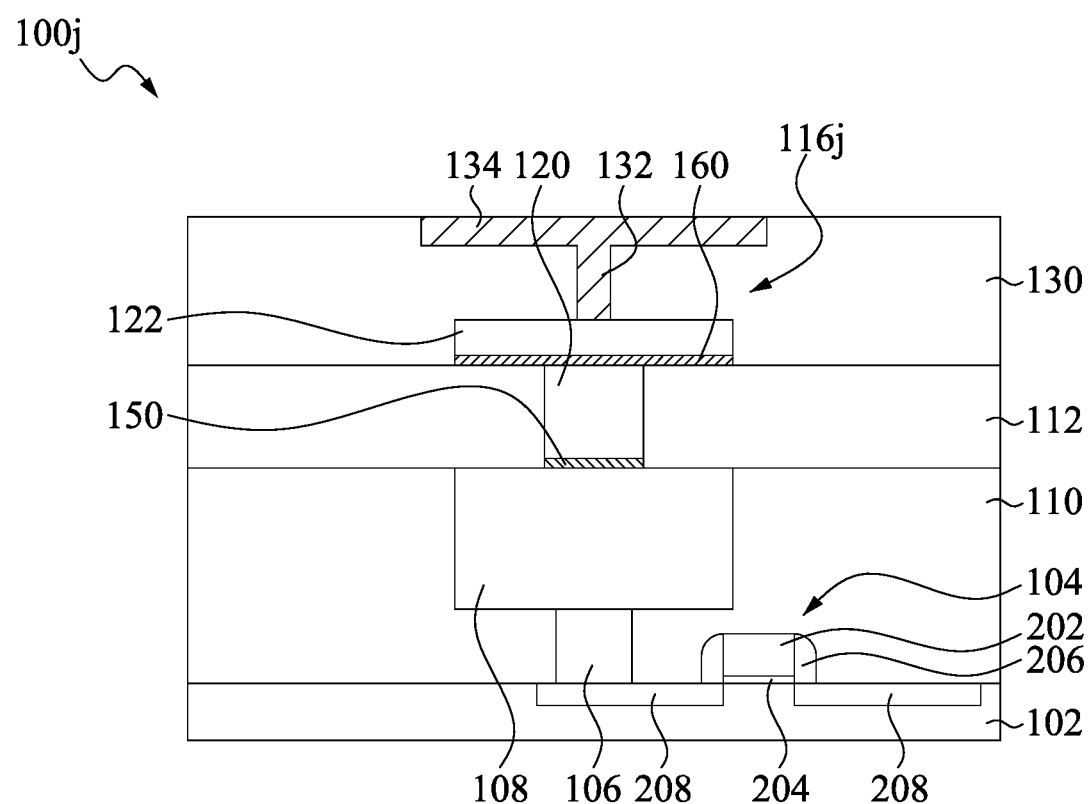

As shown in cross-sectional view of FIG. 15F, the IMD layer 130 is formed over the dielectric layer 112 and covering the second 2-D material layer 160, and the top electrode 122, followed by forming the conductive via 132 and the upper conductive wire 134 in the IMD layer 130. Formation of these elements shown in FIG. 15F is the same or similar to that described in FIGS. 2I to 2K, and thus will not be repeated hereinafter for brevity.

Figure 16:
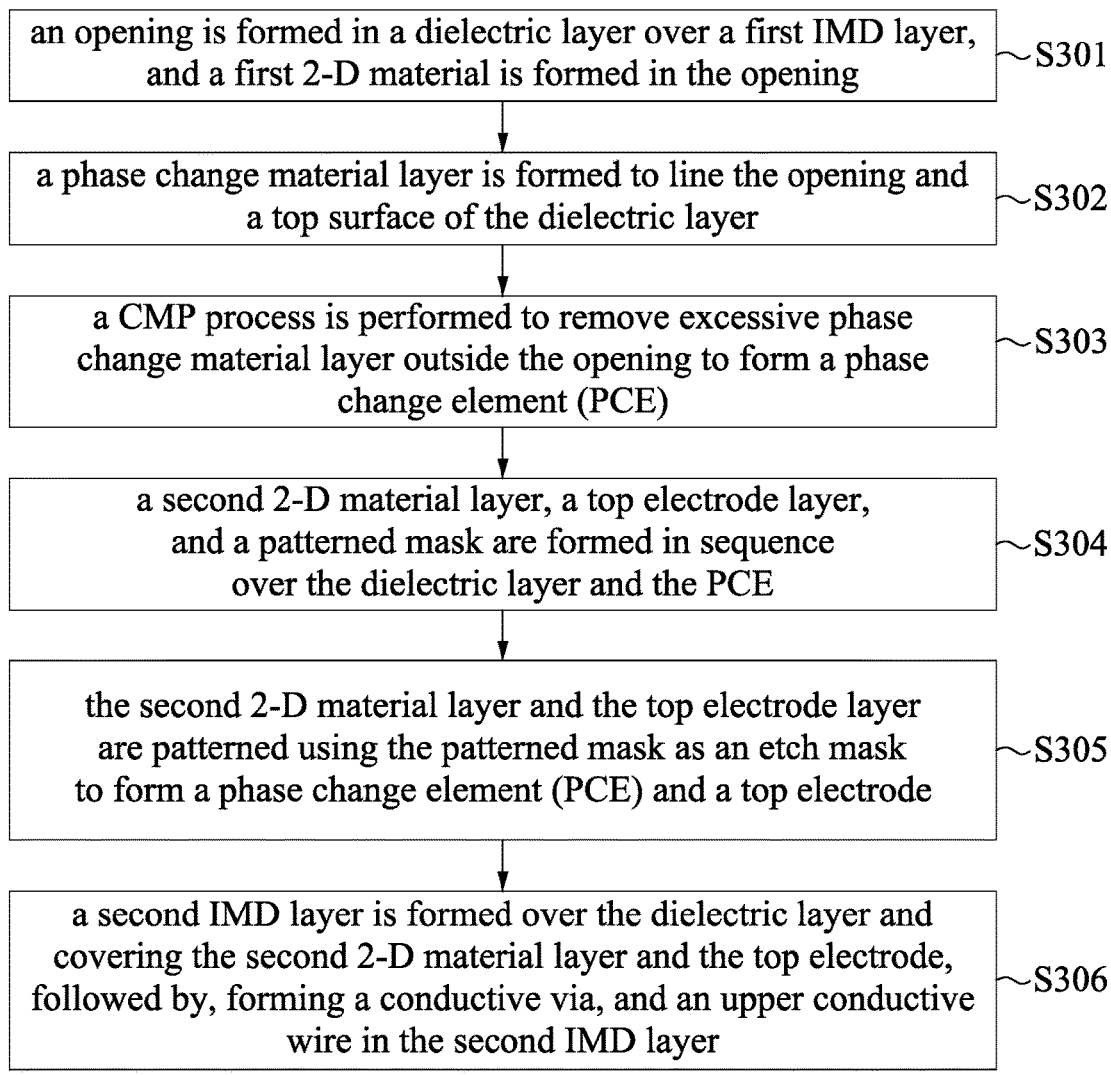
FIG. 16 illustrates a method of forming a memory device in accordance with some embodiments of the present disclosure.

FIG. 16 illustrates a method M3 of forming a memory device in accordance with some embodiments. Although the method M3 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S301, an opening is formed in a dielectric layer over a first IMD layer, and a first 2-D material is formed in the opening. FIG. 15A illustrates a cross-sectional view of some embodiments corresponding to act in block S301.

At block S302, a phase change material layer is formed to line the opening and a top surface of the dielectric layer. FIG. 15B illustrates a cross-sectional view of some embodiments corresponding to act in block S302.

At block S303, a CMP process is performed to remove excessive phase change material layer outside the opening to form a phase change element (PCE). FIG. 15C illustrates a cross-sectional view of some embodiments corresponding to act in block S303.

At block S304, a second 2-D material layer, a top electrode layer, and a patterned mask are formed over the dielectric layer and the first 2-D material layer. FIG. 15D illustrates a cross-sectional view of some embodiments corresponding to act in block S304.

At block S305, the second 2-D material layer and the top electrode layer are patterned using the patterned mask as an etch mask to form a top electrode. FIG. 15E illustrates a cross-sectional view of some embodiments corresponding to act in block S305.

At block S306, a second IMD layer is formed over the dielectric layer and covering the second 2-D material layer and the top electrode, followed by, forming a conductive via, and an upper conductive wire in the second IMD layer. FIG. 15F illustrates a cross-sectional view of some embodiments corresponding to act in block S206.

Figure 17:
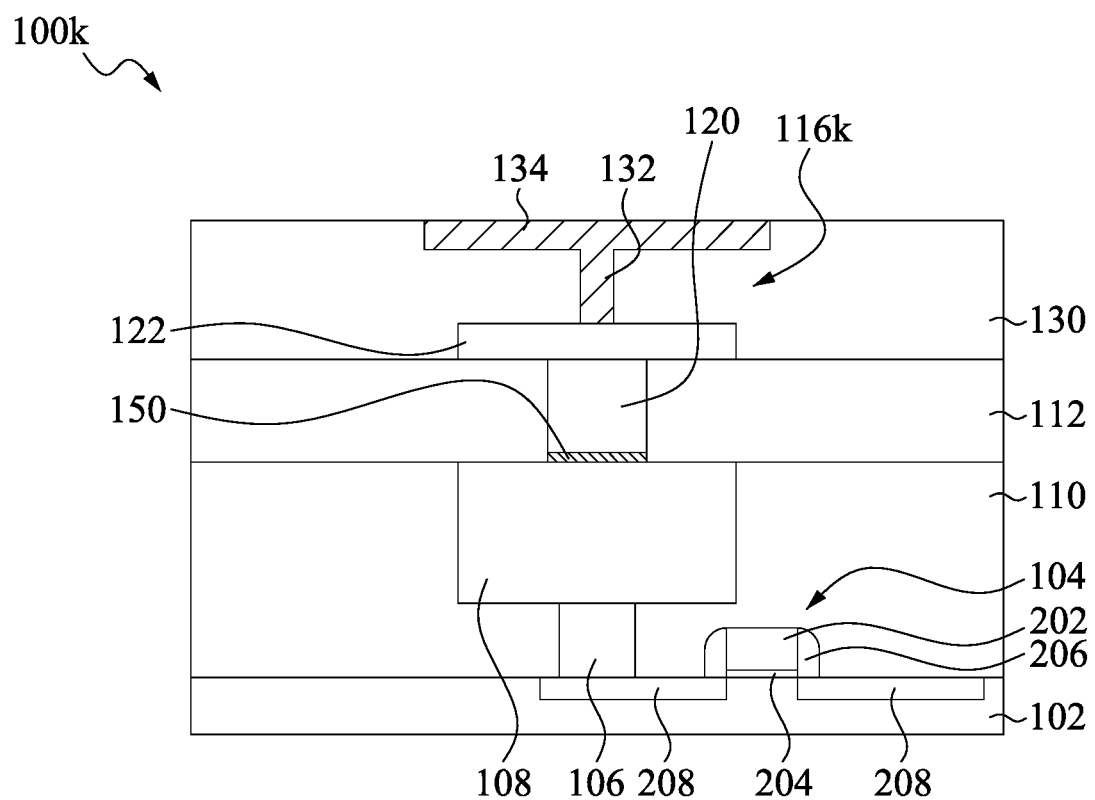
FIGS. 17-19 are cross-sectional views of memory devices in according to some embodiments of the present disclosure.
Figure 18:
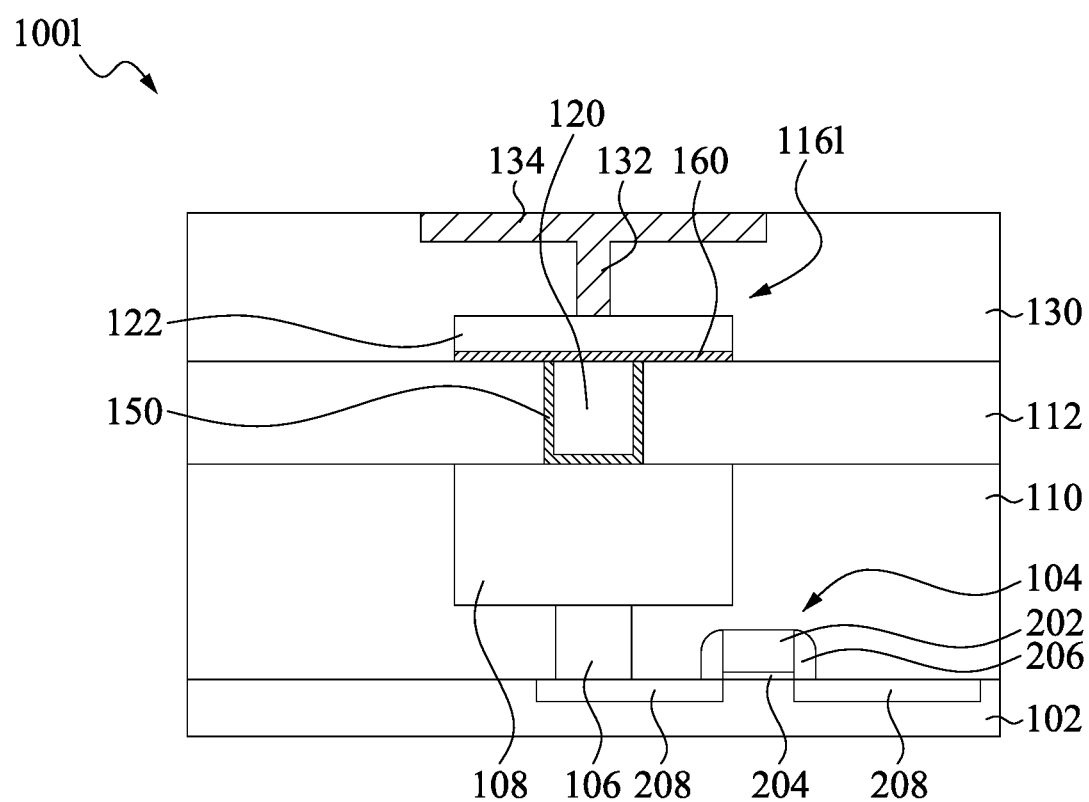
Figure 19:
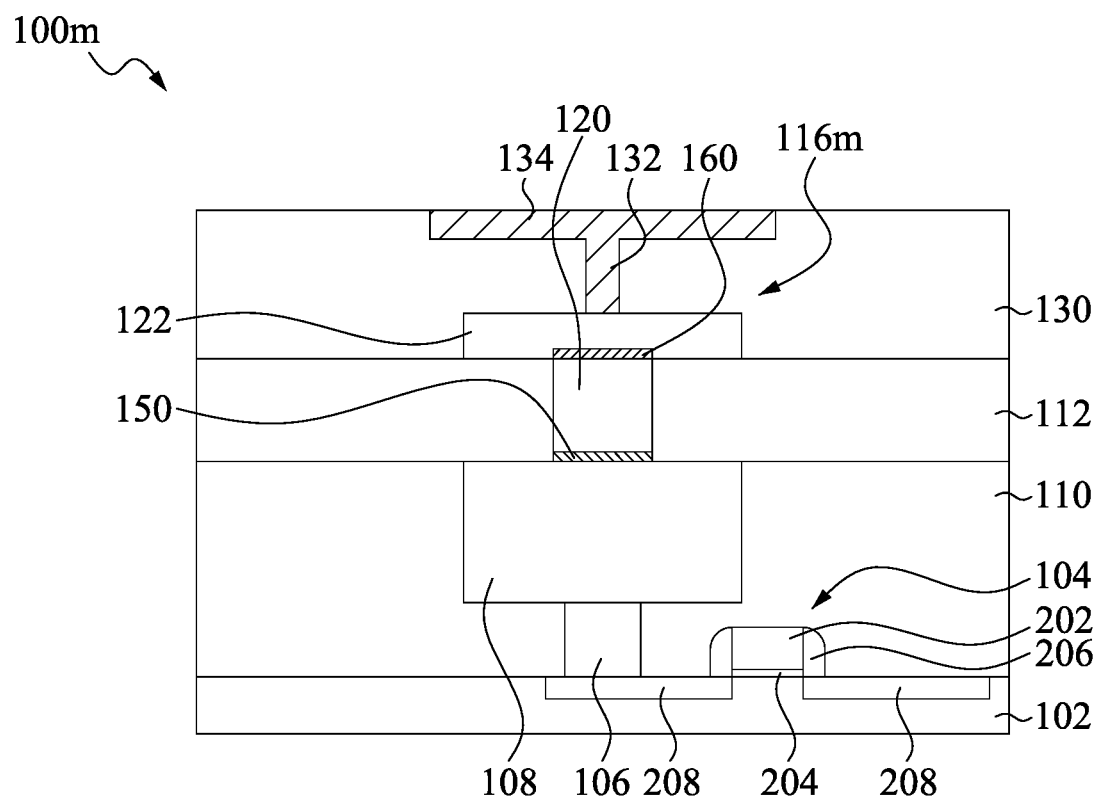

FIGS. 17 to 19 show different embodiments of the present disclosure. Some elements in FIGS. 17 to 19 are the same or similar to those described with respect to FIGS. 1, 8, and 14, and thus relevant structural details will not be repeated hereinafter.

Reference is made to FIG. 17, shown there is a memory device 100k including a PCM cell 116k. Different from the memory device 100j in FIG. 14, the second 2-D material layer 160 in FIG. 14 is omitted in the PCM cell 116k in FIG. 17, such that the top electrode 122 is in direct contact with the PCE 120. During formation of the memory device 100k, the deposition process of the second 2-D material layer 160 as illustrated in FIG. 15D can be skipped.

Reference is made to FIG. 18, shown there is a memory device 100l including a PCM cell 116l. Different from the memory device 100j in FIG. 14, the first 2-D material layer 150 in FIG. 18 extends along the sidewalls of the dielectric layer 112 and the top surface of the bottom conductive wire 108 to form a substantial U-shaped profile in cross-sectional view, such that the PCE 120 is wrapped around by the first 2-D material layer 150 and the second 2-D material layer 160. In some embodiments, the second 2-D material layer 160 laterally extends past top ends of the first 2-D material layer 150. Formation of the memory device 100l skips the directional etching process that would remove the first 2-D material layer 150 from sidewalls of the dielectric layer 112, and a portion of the first 2-D material layer 150 on the top surface of the dielectric layer 112 can be removed together with the PCE 120 by the CMP process as illustrated in FIG. 15C.

Reference is made to FIG. 19, shown there is a memory device 100m including a PCM cell 116m. Different from the memory device 100j in FIG. 14, the second 2-D material layer 160 in FIG. 19 is narrower than the top electrode 122, such that the top electrode 122 extends along the top surface of the dielectric layer 112. The memory device 100m can be formed by, for example, forming the second 2-D material layer 160 as illustrated in FIG. 15D, followed by patterning the second 2-D material layer 160 prior to forming the top electrode layer 121.

Figure 20:
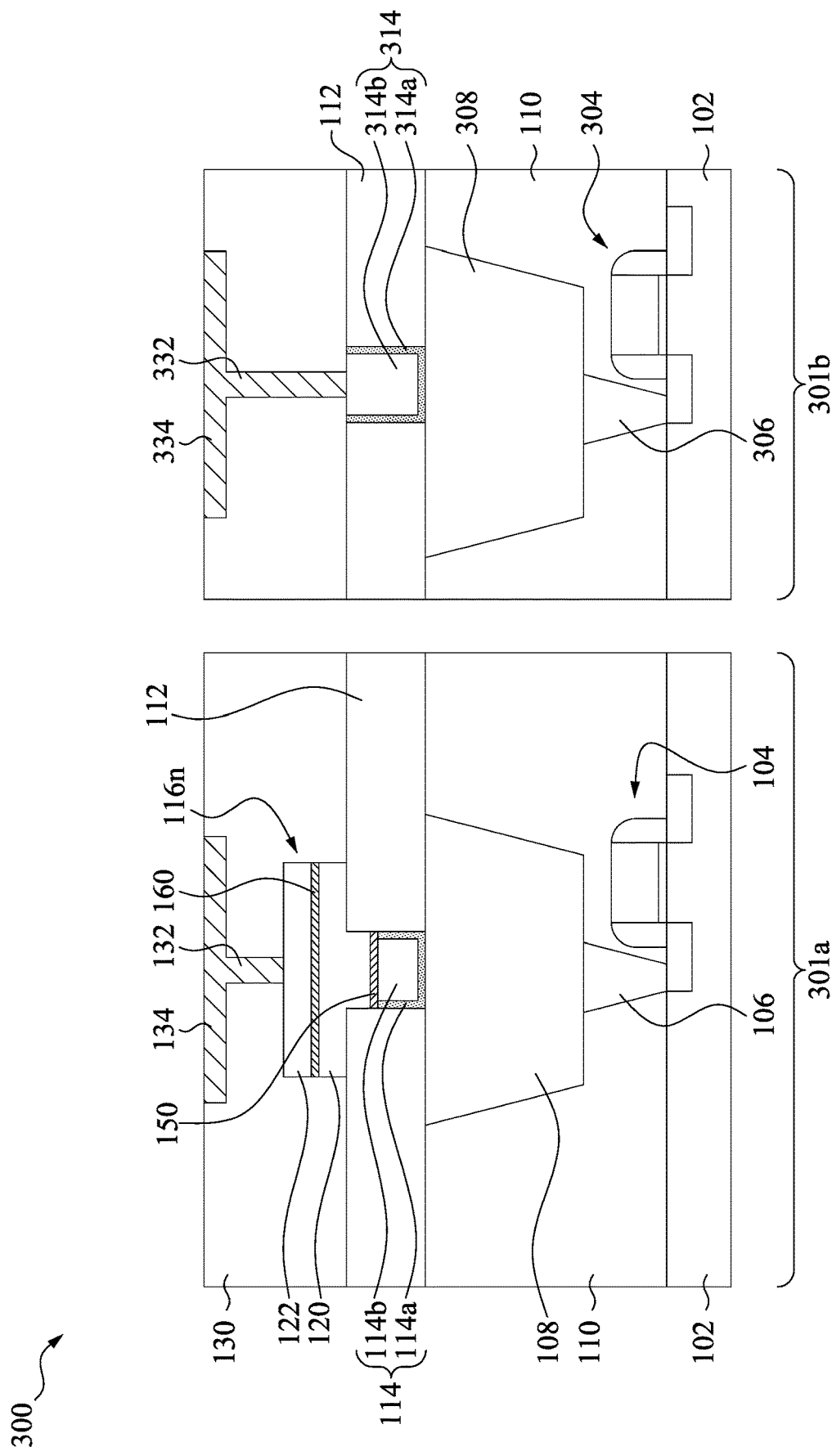
FIG. 20 is a cross-sectional view of a memory device in according to some embodiments of the present disclosure.

Referring to FIG. 20, in accordance with some embodiments, a cross-sectional view of a memory device 300 including a memory array region 301a including a PCM cell 116n and a logic region 301b is provided.

In various embodiments, the substrate 102, the transistor 104, the bottom interconnect via 106, the IMD layers 110 and 130, the dielectric layer 112, the bottom conductive wire 108, the conductive via 132, and the upper conductive wire 134 within the memory array region 301a are similar or the same as those described and labeled in FIG. 1. In some embodiments, the PCM cell 116n of FIG. 20 is similar to the PCM cell 116a described in FIG. 1, while the PCM cell 116n of FIG. 20 can also be replaced with the PCM cells 116b-m respectively in FIGS. 4A, 5, 6, 7A, 8, 11-14, and 17-19. Relevant structural details of above mentioned structures will not be repeated hereinafter for brevity. In some embodiments, the substrate 102, the IMD layers 110 and 130, and the dielectric layer 112 extend continuously from the memory array region 301a to the logic region 301b.

Within the logic region 301b, a transistor 304 is disposed within the substrate 102 and the IMD layer 110. The transistor 304 is electrically coupled to an interconnect wire 308 via a conductive contact 306. A conductive via 314 is disposed in the dielectric layer 112. Another conductive via 322 is disposed within the IMD layer 130. In some embodiments, the conductive vias 314 and/or 322 may, for example, be or include Cu, Al, or the like. In some embodiments, the conductive via 314 includes a diffusion barrier layer 314a and an electrode layer 314b wrapped by the diffusion barrier layer 314a. An upper conductive wire 334 is disposed within the IMD layer 130 and overlies the conductive via 332. In some embodiments, the upper conductive wire 334 may, for example, be or include Cu, Al, or the like.

Figure 21:
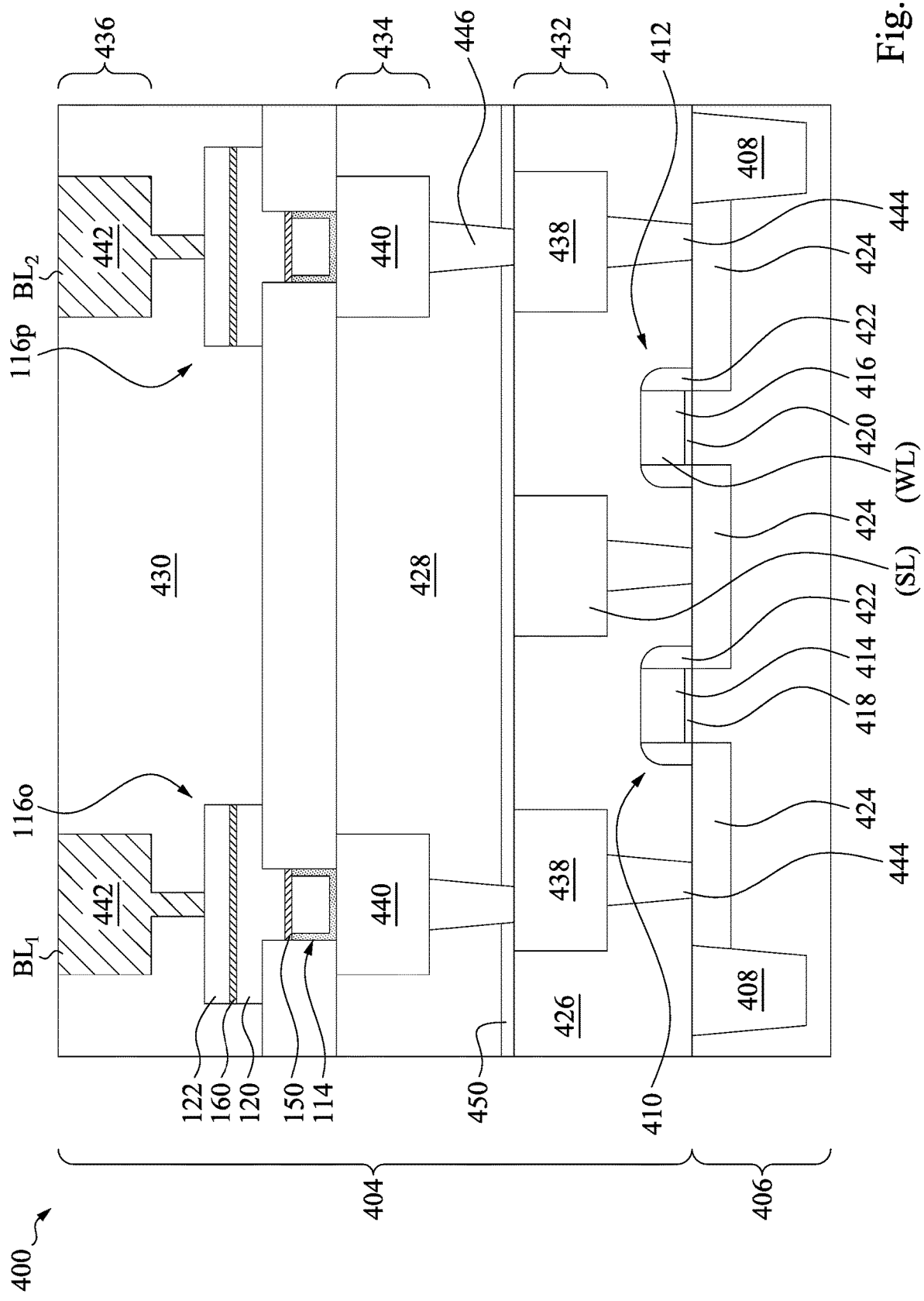
FIG. 21 is a cross-sectional view of a memory device in according to some embodiments of the present disclosure.

Referring to FIG. 21, a cross sectional view of some embodiments of an integrated circuit 400, which includes a first memory cell 116o and a second memory cell 116p disposed in an interconnect structure 404 of the integrated circuit 400. In some embodiments shown in FIG. 21, the first and second memory cells 116o/116p are similar to the PCM cell 116a described in FIG. 1, while the first and second memory cells 116o/116p of FIG. 21 can also be replaced with the PCM cells 116b-m respectively in FIGS. 4A, 5, 6, 7A, 8, 11-14, and 17-19. The integrated circuit 400 includes a substrate 406. The substrate 406 may be, for example, a bulk substrate (e.g., a bulk silicon substrate) or a silicon-on-insulator (SOI) substrate. The illustrated embodiment depicts one or more shallow trench isolation (STI) regions 408, which may include a dielectric-filled trench within the substrate 406.

Two access transistors 410, 412 are disposed between the STI regions 408. The access transistors 410, 412 include access gate electrodes 414, 416, respectively; access gate dielectrics 418, 420, respectively; access sidewall spacers 422; and source/drain regions 424. The source/drain regions 424 are disposed within the substrate 406 between the access gate electrodes 414, 416 and the STI regions 408, and are doped to have a first conductivity type which is opposite a second conductivity type of a channel region under the gate dielectrics 418, 420, respectively. The access gate electrodes 414, 416 may be, for example, doped polysilicon or a metal, such as aluminum, copper, or combinations thereof. The access gate dielectrics 418, 420 may be, for example, an oxide, such as silicon dioxide, or a high κ dielectric material. The access sidewall spacers 422 can be made of silicon nitride (e.g., Si$_3$N$_4$), for example. In some embodiments, the access transistor 410 and/or the access transistor 412 may, for example, be electrically coupled to a word line (WL) such that an appropriate WL voltage can be applied to the access gate electrode 414 and/or the access gate electrode 416.

The interconnect structure 404 is arranged over the substrate 406 and couples devices (e.g., transistors 410, 412) to one another. The interconnect structure 404 includes a plurality of IMD layers 426, 428, 430, and a plurality of metallization layers 432, 434, 436 which are layered over one another in alternating fashion. The IMD layers 426, 428, 430 may be made, for example, of a low κ dielectric, such as un-doped silicate glass, or an oxide, such as silicon dioxide, or an extreme low κ dielectric layer. The metallization layers 432, 434, 436 include metal lines 438, 440, 442, which are formed within trenches, and which may be made of a metal, such as copper or aluminum. Contacts 444 extend from the bottom metallization layer 432 to the source/drain regions 424 and/or gate electrodes 414, 416; and vias 446 extend between the metallization layers 432, 434, 436. The vias 446 extend through dielectric-protection layers 450 (which can be made of dielectric material and can act as an etch stop layer during manufacturing). The dielectric-protection layer 450 may be made of an extreme low κ dielectric material, for example. The contacts 444 and the vias 446 may be made of a metal, such as copper or tungsten, for example.

The first and second memory cells 116o, 116p, which are configured to store respective data states, are arranged within the interconnect structure 404 between neighboring metal layers. The first and second memory cells 116o, 116p respectively include: a bottom electrode 114, a phase change element (PCE) 120, and a top electrode 122. In some embodiments, the first and second memory cells 116o, 116p are respectively connected to a first bit-line (BL$_1$) and a second bit-line (BL$_2$) through the metal lines 442.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that at least one 2-D material layer is formed extending along a phase change element (PCE) of a phase change material (PCM) cell. As a result, thermal confinement of the PCE can be improved by the 2-D material layer, so that less Joule heating is needed to change the phase of the PCE, thereby allowing for the PCM cell to have a lower power consumption and/or higher switching speed.

In some embodiments of the present disclosure, a memory device includes a conductive wire, a first 2-D material layer, a phase change element, and a top electrode. The first 2-D material layer is over the conductive wire. The phase change element extends along a top surface of the first 2-D material layer. The top electrode is over the phase change element.

In some embodiments of the present disclosure, a memory device includes a conductive wire, a first 2-D material layer, a phase change element, and a top electrode. The phase change element is over the conductive wire. The first 2-D material layer extends along a top surface of the phase change element. The top electrode is over the first 2-D material layer.

In some embodiments of the present disclosure, a method includes depositing a dielectric layer over a conductive wire; etching the dielectric layer to form an opening in the dielectric layer; forming a first 2-D material layer in the opening in the dielectric layer; after forming the first 2-D material layer in the opening in the dielectric layer, depositing a phase change material layer to fill the opening in the dielectric layer; depositing a top electrode layer over the phase change material layer; and patterning the phase change material layer and the top electrode layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
    a conductive wire;
    a dielectric layer over the conductive wire;
    a bottom electrode in the dielectric layer over the conductive wire, wherein a bottom surface of the bottom electrode is level with a bottom surface of the dielectric layer;

a first 2-D material layer over and in contact with the bottom electrode, wherein the first 2-D material layer vertically overlaps an entirety of the bottom electrode;
a phase change element spaced from the conductive wire at least in part by the first 2-D material layer; and
a top electrode over the phase change element.

2. The memory device of claim 1, further comprising:
a bottom electrode between the conductive wire and the first 2-D material layer.

3. The memory device of claim 1, wherein the phase change element has a sidewall extending upwards from a surface of the first 2-D material layer distal to the conductive wire.

4. The memory device of claim 1, wherein a surface of the phase change element proximal to the conductive wire extends along a surface of the first 2-D material layer distal to the conductive wire.

5. The memory device of claim 1, further comprising:
a second 2-D material layer between the phase change element and the top electrode.

6. The memory device of claim 5, wherein the first 2-D material layer is narrower than the second 2-D material layer.

7. The memory device of claim 5, wherein the second 2-D material layer extends along a surface of the phase change element distal to the conductive wire.

8. The memory device of claim 5, wherein the second 2-D material layer overlaps an entirety of a surface of the phase change element distal to the conductive wire.

9. The memory device of claim 1, further comprising:
a dielectric layer laterally surrounding the phase change element and the first 2-D material layer.

10. A memory device, comprising:
a conductive wire;
a bottom electrode over the conductive wire;
a phase change element over the bottom electrode;
a first 2-D material layer over the phase change element;
a second 2-D material layer between the phase change element and the bottom electrode, wherein a width of the second 2-D material layer is equal to a maximum width of the bottom electrode; and
a top electrode spaced from the phase change element at least in part by the first 2-D material layer.

11. The memory device of claim 10, wherein the first 2-D material layer has a width greater than a width of a bottom-most portion of the phase change element.

12. The memory device of claim 10, further comprising:
an inter-metal dielectric (IMD) layer laterally surrounding the phase change element, wherein the first 2-D material layer is in contact with a surface of the IMD layer.

13. The memory device of claim 10, wherein a sidewall of the top electrode, a sidewall of the phase change element, and a sidewall of the first 2-D material layer are vertically aligned.

14. A memory device, comprising:
a first transistor and a second transistor over a substrate;
a first conductive wire over and electrically connected to the first transistor;
a second conductive wire over and electrically connected to the second transistor;
a dielectric layer over the first and second conductive wires;
a bottom electrode in the dielectric layer and in contact with the first conductive wire, wherein a top surface of the bottom electrode is lower than a top surface of the dielectric layer;
a conductive via in the dielectric layer and in contact with the second conductive wire, wherein a top surface of the conductive via is level with the top surface of the dielectric layer;
a first 2-D material layer disposed on the bottom electrode;
a phase change element over the first 2-D material layer, wherein the phase change element is separated from the bottom electrode by the first 2-D material layer;
a second 2-D material layer over the phase change element; and
a top electrode over the second 2-D material layer, wherein the top electrode is separated from the phase change element by the second 2-D material layer.

15. The memory device of claim 14, wherein the dielectric layer is in contact with the bottom electrode and the phase change element.

16. The memory device of claim 15, wherein the phase change element has an upper portion over a top surface of the dielectric layer, the upper portion is wider than a lower portion of the phase change element, and the second 2-D material layer is in contact with the upper portion of the phase change element.

17. The memory device of claim 14, wherein the first 2-D material layer is narrower than the second 2-D material layer.

18. The memory device of claim 14, wherein the bottom electrode comprises an electrode layer and a diffusion barrier surrounding the electrode layer, the first 2-D material layer is in contact with the electrode layer and the diffusion barrier.

19. The memory device of claim 14, further comprising an inter-metal dielectric (IMD) layer laterally surrounding the phase change element, wherein the second 2-D material layer is in contact with the IMD layer.

20. The memory device of claim 19, wherein a sidewall of the phase change element is in contact with the IMD layer.

* * * * *